United States Patent
Zhang et al.

(10) Patent No.: US 8,860,932 B2
(45) Date of Patent: Oct. 14, 2014

(54) DETECTION OF LAYER CLEARING USING SPECTRAL MONITORING

(75) Inventors: Jimin Zhang, San Jose, CA (US); Zhihong Wang, Santa Clara, CA (US); Harry Q. Lee, Los Altos, CA (US); Wen-Chiang Tu, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 391 days.

(21) Appl. No.: 13/189,277

(22) Filed: Jul. 22, 2011

(65) Prior Publication Data

US 2012/0026492 A1    Feb. 2, 2012

Related U.S. Application Data

(60) Provisional application No. 61/369,540, filed on Jul. 30, 2010.

(51) Int. Cl.
| | | |
|---|---|---|
| *G01N 21/00* | (2006.01) | |
| *G01J 3/00* | (2006.01) | |
| *B24B 37/04* | (2012.01) | |
| *H01L 21/66* | (2006.01) | |
| *B24B 37/013* | (2012.01) | |
| *G01B 11/06* | (2006.01) | |
| *H01L 21/321* | (2006.01) | |

(52) U.S. Cl.
CPC ........... *B24B 37/013* (2013.01); *G01B 11/0633* (2013.01); *G01B 11/0683* (2013.01); *H01L 21/3212* (2013.01); *B24B 37/042* (2013.01); *H01L 22/12* (2013.01); *H01L 22/26* (2013.01)
USPC ............................................. 356/72; 356/300

(58) Field of Classification Search
CPC .. B24B 37/013; B24B 49/12; G01B 11/0683; G01B 11/0633; G01N 21/55
USPC ............................................. 356/300–334, 72
See application file for complete search history.

(56) References Cited

U.S. PATENT DOCUMENTS

| | | | | |
|---|---|---|---|---|
| 5,565,114 | A | * | 10/1996 | Saito et al. ...................... 216/60 |
| 5,928,532 | A | * | 7/1999 | Koshimizu et al. ........ 219/121.42 |
| 6,051,500 | A | * | 4/2000 | Maury et al. .................. 438/692 |
| 6,153,116 | A | * | 11/2000 | Yang et al. ....................... 216/85 |
| 6,271,047 | B1 | * | 8/2001 | Ushio et al. ..................... 438/14 |
| 6,670,200 | B2 | | 12/2003 | Ushio et al. |

(Continued)

OTHER PUBLICATIONS

Sampurno et al. "Applications of Shear Force Spectral Analysis in STI CMP" International Conference on Planarization/CMP Technology (ICPT) Oct. 25-27, 2007, pp. 1-5.

(Continued)

*Primary Examiner* — Michael A Lyons
*Assistant Examiner* — Shawn Decenzo
(74) *Attorney, Agent, or Firm* — Fish & Richardson P.C.

(57) ABSTRACT

A method of polishing includes polishing a substrate having a second layer overlying a first layer, measuring a sequence of groups of spectra of light from the substrate while the substrate is being polished, each group of the groups of spectra including spectra from different locations on the substrate, for each group, calculating a value for a dispersion parameter of the spectra in the group to generate a sequence of dispersion values, and detecting exposure of the first layer based on the sequence of dispersion values.

21 Claims, 20 Drawing Sheets

(56) References Cited

U.S. PATENT DOCUMENTS

| | | | |
|---|---|---|---|
| 6,897,079 B2* | 5/2005 | Hirose et al. | 438/16 |
| 7,074,109 B1* | 7/2006 | Bennett et al. | 451/5 |
| 7,942,724 B2* | 5/2011 | Benvegnu et al. | 451/6 |
| 8,388,408 B2* | 3/2013 | Kobayashi et al. | 451/5 |
| 2003/0022400 A1* | 1/2003 | Nomoto et al. | 438/14 |
| 2008/0206993 A1* | 8/2008 | Lee et al. | 438/692 |
| 2008/0274670 A1 | 11/2008 | Tada et al. | |
| 2010/0129939 A1 | 5/2010 | David et al. | |
| 2010/0130100 A1* | 5/2010 | David et al. | 451/5 |
| 2011/0104987 A1* | 5/2011 | David et al. | 451/5 |

OTHER PUBLICATIONS

Wu "Modeling of Wafer Topography's Effect on Chemical-Mechanical Polishing Process" IEEE Trans. Semiconduct. Manuf. 2007 20(4):439-450.

Korean Search Report & Written Opinion for Application No. PCT/US2011/045025, dated Mar. 19, 2012, 13 pages.

* cited by examiner

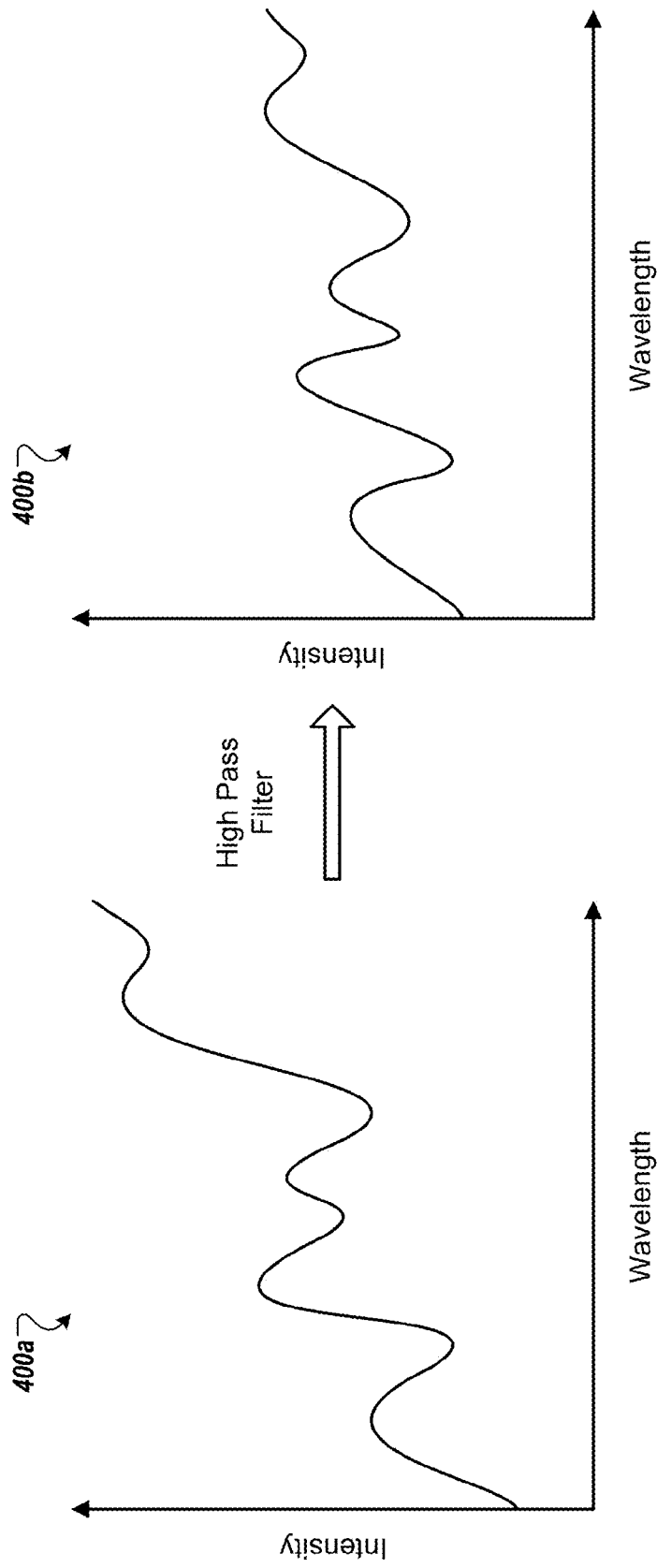

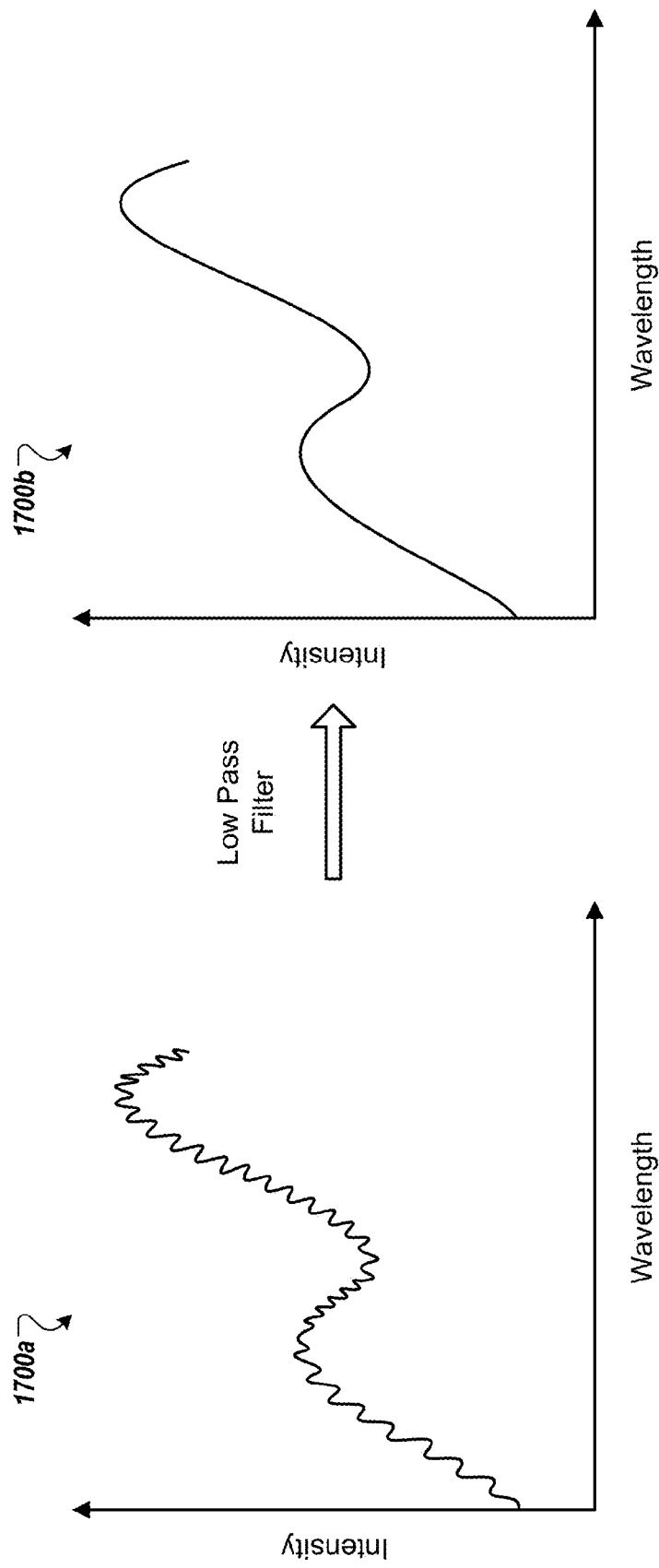

DETECTION OF LAYER CLEARING USING SPECTRAL MONITORING

CROSS-REFERENCE TO RELATED APPLICATIONS

This application claims priority to U.S. Application Ser. No. 61/369,540, filed on Jul. 30, 2010, which is incorporated by reference.

TECHNICAL FIELD

The present disclosure relates to optical monitoring during chemical mechanical polishing of substrates.

BACKGROUND

An integrated circuit is typically formed on a substrate by the sequential deposition of conductive, semiconductive, or insulative layers on a silicon wafer. One fabrication step involves depositing a filler layer over a non-planar surface and planarizing the filler layer. For certain applications, the filler layer is planarized until the top surface of a patterned layer is exposed. A conductive filler layer, for example, can be deposited on a patterned insulative layer to fill the trenches or holes in the insulative layer. After planarization, the portions of the conductive layer remaining between the raised pattern of the insulative layer form vias, plugs, and lines that provide conductive paths between thin film circuits on the substrate. For other applications, such as oxide polishing, the filler layer is planarized until a predetermined thickness is left over the non planar surface. In addition, planarization of the substrate surface is usually required for photolithography.

Chemical mechanical polishing (CMP) is one accepted method of planarization. This planarization method typically requires that the substrate be mounted on a carrier or polishing head. The exposed surface of the substrate is typically placed against a rotating polishing pad. The carrier head provides a controllable load on the substrate to push it against the polishing pad. An abrasive polishing slurry is typically supplied to the surface of the polishing pad.

One problem in CMP is determining whether the polishing process is complete, i.e., whether a substrate layer has been planarized to a desired flatness or thickness, or when a desired amount of material has been removed. Variations in the slurry distribution, the polishing pad condition, the relative speed between the polishing pad and the substrate, and the load on the substrate can cause variations in the material removal rate. These variations, as well as variations in the initial thickness of the substrate layer, cause variations in the time needed to reach the polishing endpoint. Therefore, the polishing endpoint cannot be determined merely as a function of polishing time.

In some systems, a substrate is optically monitored in-situ during polishing, e.g., through a window in the polishing pad. However, existing optical monitoring techniques may not satisfy increasing demands of semiconductor device manufacturers.

SUMMARY

During polishing, multiple spectra can be collected in each sweep of an optical monitoring system across the substrate. The spectra in a single sweep are collected from different locations on the substrate. As an overlying layer, e.g., a barrier layer, is cleared, and an underlying layer, e.g., a low-k or capping layer, is exposed, the spectra from different locations tend to diverge. The distribution of spectra can be analyzed and used to detect clearance of the overlying layer.

In one aspect, a method of polishing includes polishing a substrate having a second layer overlying a first layer, measuring a sequence of groups of spectra of light from the substrate while the substrate is being polished, each group of the groups of spectra including spectra from different locations on the substrate, for each group, calculating a value for a dispersion parameter of the spectra in the group to generate a sequence of dispersion values, and detecting exposure of the first layer based on the sequence of dispersion values.

Implementations can include one or more of the following features. Calculating the value of the dispersion parameter may include calculating a difference value for each spectrum in the group to generate a plurality of difference values. Calculating the value of the dispersion parameter may include calculating a standard deviation, range, mean difference, median absolute deviation or average absolute deviation of the plurality of difference values. Calculating the value of the dispersion parameter may include calculating a standard deviation. Calculating the difference value may include calculating an average spectrum from the spectra in the group, and calculating a total difference between the spectrum and the average spectrum. Detecting exposure of the first layer may include comparing the sequence of dispersion values to a threshold. Detecting exposure of the first layer may include determining a slope from the sequence of dispersion values and comparing the slope to a threshold. A polishing parameter may be modified when exposure of the first layer is detected. Polishing may be halted when exposure of the first layer is detected. An identification of a selected spectral feature and a characteristic of the selected spectral feature to monitor during polishing may be received, a sequence of spectra of light from the substrate may be measured while the substrate is being polished, a first value for the characteristic of the feature in a spectrum may be determined from the sequence at a time that exposure of the first layer is detected, an offset may be added to the first value to generate a second value, and the characteristic of the feature in the sequence of spectra may be monitored and polishing may be halted when the characteristic of the feature is determined to reach the second value. An identification of a selected spectral feature to monitor during polishing may be received, a sequence of spectra of light from the substrate may be measured while the substrate is being polished, a location value and an associated intensity value of the selected spectral feature may be determined for each of the spectra in the sequence of spectra to generate a sequence of coordinates, the coordinates being pairs of location values and associated intensity values, a starting coordinate may be determined from a spectrum from the sequence at a time that exposure of the first layer is detected, a distance from the staring coordinate to a current coordinate may be determined, and a polishing endpoint or an adjustment for a polishing rate may be determined based on the distance. Measuring the sequence of groups of spectra of light from the substrate may include making a plurality of sweeps of a sensor across the substrate. Each group of spectra from the sequence of groups may correspond to a single sweep of the sensor from the plurality of sweeps. Making a plurality of sweeps of a sensor across the substrate may include rotating a platen having a sensor fixed thereto. The sequence of dispersion values may be filtered. The second layer may be a barrier layer. The first layer may be a dielectric layer having a different composition than the barrier layer. The barrier layer may be tantalum nitride or titanium nitride and the dielectric layer may be carbon doped silicon dioxide or be formed from tetraethyl orthosilicate.

In another aspect, the a computer program product, tangibly embodied in a machine readable storage device, includes instructions to carry out the method.

In another aspect, a polishing apparatus includes a support to hold a polishing pad, a carrier head to hold a substrate against the polishing pad, a motor to generate relative motion between the carrier head and the support to polish the substrate, an optical monitoring system to measure a sequence of groups of spectra of light from the substrate while the substrate is being polished, the relative motion between the carrier head and the support causing each group of the groups of spectra to include spectra from different locations on the substrate, and a controller configured to, for each group, calculate a value for a dispersion parameter of the spectra in the group to generate a sequence of dispersion values, and detect exposure of the first layer based on the sequence of dispersion values.

Implementations may optionally include one or more of the following advantages. Detection of clearance of an overlying layer, e.g., a barrier layer, can be more reliable, and thus a subsequent polishing endpoint can be more reliable, and wafer-to-wafer thickness non-uniformity (WTWNU) can be reduced.

The details of one or more implementations are set forth in the accompanying drawings and the description below. Other aspects, features, and advantages will be apparent from the description and drawings, and from the claims.

BRIEF DESCRIPTION OF THE DRAWINGS

FIG. 4A shows an example graph of a spectrum of light reflected from a substrate.

FIG. 4B shows the graph of FIG. 4A passed through a high pass filter.

FIG. 17A shows an example graph of a spectrum of light reflected from a substrate.

FIG. 17B shows the graph of FIG. 17A passed through a low pass filter.

Like reference numbers and designations in the various drawings indicate like elements.

DETAILED DESCRIPTION

Figure 1:
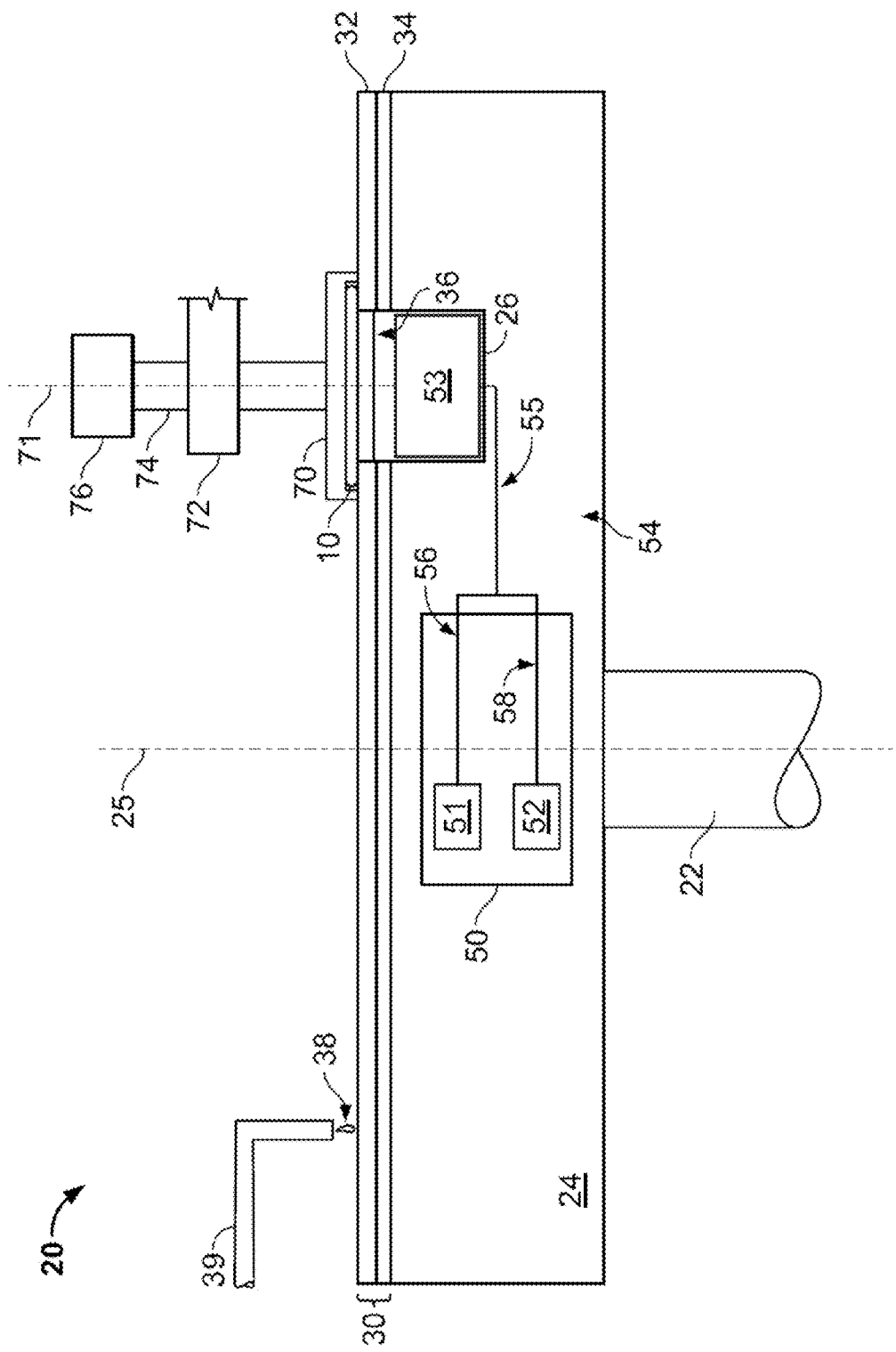
FIG. 1 shows a chemical mechanical polishing apparatus.

One optical monitoring technique is to measure spectra of light reflected from a substrate during polishing, and identify a matching reference spectra from a library. One potential problem with the spectrum matching approach is that for some types of substrates there are significant substrate-to-substrate differences in underlying die features, resulting in variations in the spectra reflected from substrates that ostensibly have the same outer layer thickness. These variations increase the difficulty of proper spectrum matching and reduce reliability of the optical monitoring.

One technique to counteract this problem is to measure spectra of light reflected off of substrates being polished and identify changes in spectral feature characteristics. Tracking changes in a characteristic of a feature of the spectrum, e.g., a wavelength of a spectral peak, can allow greater uniformity in polishing between substrates within a batch. By determining a target difference in the spectral feature characteristic, endpoint can be called when the value of the characteristic has changed by the target amount. Spectral features can include spectral peaks, spectral valleys, spectral inflection points, or spectral zero-crossings. Characteristics of the features can include a wavelength, a width, or an intensity.

A layer stack of a substrate can include a patterned first layer of a first dielectric material, e.g., a low-k material, e.g., carbon doped silicon dioxide, e.g., Black Diamond™ (from Applied Materials, Inc.) or Coral™ (from Novellus Systems, Inc.). Disposed over the first layer is a second layer of a different second dielectric material, e.g., e.g., a barrier layer, e.g., a nitride, e.g., tantalum nitride or titanium nitride. Optionally disposed between the first layer and the second layer are one or more additional layers of another dielectric material, different from both the first and second dielectric materials, e.g., a low-k capping material, e.g., tetraethyl orthosilicate (TEOS). Together, the first layer and the one or more additional layers provide a layer stack below the second layer. Disposed over the second layer (and in trenches provided by the pattern of the first layer) is a conductive material, e.g., a metal, e.g., copper.

One use of chemical mechanical polishing is to planarize the substrate until the first layer of the first dielectric material is exposed. After planarization, the portions of the conductive layer remaining between the raised pattern of the first layer form vias and the like. In addition, it is sometimes desired to remove the first dielectric material until a target thickness remains.

One method of polishing is to polish the conductive layer on a first polishing pad at least until the second layer, e.g., the barrier layer, is exposed. In addition, a portion of the thickness of the second layer can be removed, e.g., during an overpolishing step at the first polishing pad. The substrate is then transferred to a second polishing pad, where the second layer, e.g., the barrier layer is completely removed, and a portion of the thickness of the underlying first layer, e.g., the low-k dielectric, is also removed. In addition, if present, the additional layer or layers between the first and second layer can be removed in the same polishing operation at the second polishing pad.

However, the initial thickness of the second layer may not be known when the substrate is transferred to the second polishing pad. As noted above, this can pose a problem for optical endpoint detection techniques that track a selected spectral feature characteristic in spectra measurements in order to determine endpoint at a target thickness. However, this problem can be reduced if spectral feature tracking is triggered by another monitoring technique that can reliably detect removal of the second dielectric material and exposure of the underlying layer or layer structure. In addition, measuring the initial thickness of the first layer and by calculating a target feature value from the initial thickness and the target thickness for the first layer, substrate-to-substrate uniformity of the thickness of the first layer can be improved.

For some layer stacks, such as barrier layer overlying a TEOS layer, detection of clearance of the overlying layer and exposure of the underlying layer can be difficult. However, as the overlying layer, e.g., a barrier layer, is cleared, and an underlying layer, e.g., a low-k or capping layer, is exposed, the spectra from different locations tend to diverge. The divergence of the spectra can be analyzed and a value of deviation parameter can be calculated. By detecting when the value of the deviation parameter changes, the clearance of the overlying layer can be detected.

FIG. 1 shows a polishing apparatus 20 operable to polish a substrate 10. The polishing apparatus 20 includes a rotatable disk-shaped platen 24, on which a polishing pad 30 is situated. The platen is operable to rotate about axis 25. For example, a motor can turn a drive shaft 22 to rotate the platen 24. The polishing pad 30 can be detachably secured to the platen 24, for example, by a layer of adhesive. When worn, the polishing pad 30 can be detached and replaced. The polishing pad 30 can be a two-layer polishing pad with an outer polishing layer 32 and a softer backing layer 34.

Optical access 36 through the polishing pad is provided by including an aperture (i.e., a hole that runs through the pad) or a solid window. The solid window can be secured to the polishing pad, although in some implementations the solid window can be supported on the platen 24 and project into an aperture in the polishing pad. The polishing pad 30 is usually placed on the platen 24 so that the aperture or window overlies an optical head 53 situated in a recess 26 of the platen 24. The optical head 53 consequently has optical access through the aperture or window to a substrate being polished.

The window can be, for example, a rigid crystalline or glassy material, e.g., quartz or glass, or a softer plastic material, e.g., silicone, polyurethane or a halogenated polymer (e.g., a fluoropolymer), or a combination of the materials mentioned. The window can be transparent to white light. If a top surface of the solid window is a rigid crystalline or glassy material, then the top surface should be sufficiently recessed from the polishing surface to prevent scratching. If the top surface is near and may come into contact with the polishing surface, then the top surface of the window should be a softer plastic material. In some implementations the solid window is secured in the polishing pad and is a polyurethane window, or a window having a combination of quartz and polyurethane. The window can have high transmittance, for example, approximately 80% transmittance, for monochromatic light of a particular color, for example, blue light or red light. The window can be sealed to the polishing pad 30 so that liquid does not leak through an interface of the window and the polishing pad 30.

In one implementation, the window includes a rigid crystalline or glassy material covered with an outer layer of a softer plastic material. The top surface of the softer material can be coplanar with the polishing surface. The bottom surface of the rigid material can be coplanar with or recessed relative to the bottom surface of the polishing pad. In particular, if the polishing pad includes two layers, the solid window can be integrated into the polishing layer, and the bottom layer can have an aperture aligned with the solid window.

A bottom surface of the window can optionally include one or more recesses. A recess can be shaped to accommodate, for example, an end of an optical fiber cable or an end of an eddy current sensor. The recess allows the end of the optical fiber cable or the end of the eddy current sensor to be situated at a distance, from a substrate surface being polished, that is less than a thickness of the window. With an implementation in which the window includes a rigid crystalline portion or glass like portion and the recess is formed in such a portion by machining, the recess is polished so as to remove scratches caused by the machining. Alternatively, a solvent and/or a liquid polymer can be applied to the surfaces of the recess to remove scratches caused by machining. The removal of scratches usually caused by machining reduces scattering and can improve the transmittance of light through the window.

The polishing pad's backing layer 34 can be attached to its outer polishing layer 32, for example, by adhesive. The aperture that provides optical access 36 can be formed in the pad 30, e.g., by cutting or by molding the pad 30 to include the aperture, and the window can be inserted into the aperture and secured to the pad 30, e.g., by an adhesive. Alternatively, a liquid precursor of the window can be dispensed into the aperture in the pad 30 and cured to form the window. Alternatively, a solid transparent element, e.g., the above described crystalline or glass like portion, can be positioned in liquid pad material, and the liquid pad material can be cured to form the pad 30 around the transparent element. In either of the later two cases, a block of pad material can be formed, and a layer of polishing pad with the molded window can be scythed from the block.

The polishing apparatus 20 includes a combined slurry/rinse arm 39. During polishing, the arm 39 is operable to dispense slurry 38 containing a liquid and a pH adjuster. Alternatively, the polishing apparatus includes a slurry port operable to dispense slurry onto polishing pad 30.

The polishing apparatus 20 includes a carrier head 70 operable to hold the substrate 10 against the polishing pad 30. The carrier head 70 is suspended from a support structure 72, for example, a carousel, and is connected by a carrier drive shaft 74 to a carrier head rotation motor 76 so that the carrier head can rotate about an axis 71. In addition, the carrier head 70 can oscillate laterally in a radial slot formed in the support structure 72. In operation, the platen is rotated about its central axis 25, and the carrier head is rotated about its central axis 71 and translated laterally across the top surface of the polishing pad.

The polishing apparatus also includes an optical monitoring system, which can be used to determine a polishing endpoint as discussed below. The optical monitoring system includes a light source 51 and a light detector 52. Light passes from the light source 51, through the optical access 36 in the polishing pad 30, impinges and is reflected from the substrate 10 back through the optical access 36, and travels to the light detector 52.

A bifurcated optical cable 54 can be used to transmit the light from the light source 51 to the optical access 36 and back from the optical access 36 to the light detector 52. The bifurcated optical cable 54 can include a "trunk" 55 and two "branches" 56 and 58.

As mentioned above, the platen 24 includes the recess 26, in which the optical head 53 is situated. The optical head 53 holds one end of the trunk 55 of the bifurcated fiber cable 54, which is configured to convey light to and from a substrate surface being polished. The optical head 53 can include one or more lenses or a window overlying the end of the bifurcated fiber cable 54. Alternatively, the optical head 53 can merely hold the end of the trunk 55 adjacent to the solid window in the polishing pad. The optical head 53 can be removed from the recess 26 as required, for example, to effect preventive or corrective maintenance.

The platen includes a removable in-situ monitoring module 50. The in-situ monitoring module 50 can include one or more of the following: the light source 51, the light detector 52, and circuitry for sending and receiving signals to and from the light source 51 and light detector 52. For example, the output of the detector 52 can be a digital electronic signal that passes through a rotary coupler, e.g., a slip ring, in the drive shaft 22 to the controller for the optical monitoring system. Similarly, the light source can be turned on or off in response to control commands in digital electronic signals that pass from the controller through the rotary coupler to the module 50.

The in-situ monitoring module 50 can also hold the respective ends of the branch portions 56 and 58 of the bifurcated optical fiber 54. The light source is operable to transmit light, which is conveyed through the branch 56 and out the end of the trunk 55 located in the optical head 53, and which impinges on a substrate being polished. Light reflected from the substrate is received at the end of the trunk 55 located in the optical head 53 and conveyed through the branch 58 to the light detector 52.

In one implementation, the bifurcated fiber cable 54 is a bundle of optical fibers. The bundle includes a first group of optical fibers and a second group of optical fibers. An optical fiber in the first group is connected to convey light from the light source 51 to a substrate surface being polished. An optical fiber in the second group is connected to receive light reflecting from the substrate surface being polished and convey the received light to the light detector 52. The optical fibers can be arranged so that the optical fibers in the second group form an X-like shape that is centered on the longitudinal axis of the bifurcated optical fiber 54 (as viewed in a cross section of the bifurcated fiber cable 54). Alternatively, other arrangements can be implemented. For example, the optical fibers in the second group can form V-like shapes that are mirror images of each other. A suitable bifurcated optical fiber is available from Verity Instruments, Inc. of Carrollton, Tex.

There is usually an optimal distance between the polishing pad window and the end of the trunk 55 of bifurcated fiber cable 54 proximate to the polishing pad window. The distance can be empirically determined and is affected by, for example, the reflectivity of the window, the shape of the light beam emitted from the bifurcated fiber cable, and the distance to the substrate being monitored. In one implementation, the bifurcated fiber cable is situated so that the end proximate to the window is as close as possible to the bottom of the window without actually touching the window. With this implementation, the polishing apparatus 20 can include a mechanism, e.g., as part of the optical head 53, that is operable to adjust the distance between the end of the bifurcated fiber cable 54 and the bottom surface of the polishing pad window. Alternatively, the proximate end of the bifurcated fiber cable 54 is embedded in the window.

The light source 51 is operable to emit white light. In one implementation, the white light emitted includes light having wavelengths of 200-800 nanometers. A suitable light source is a xenon lamp or a xenon-mercury lamp.

The light detector 52 can be a spectrometer. A spectrometer is basically an optical instrument for measuring properties of light, for example, intensity, over a portion of the electromagnetic spectrum. A suitable spectrometer is a grating spectrometer. Typical output for a spectrometer is the intensity of the light as a function of wavelength.

Figure 2:
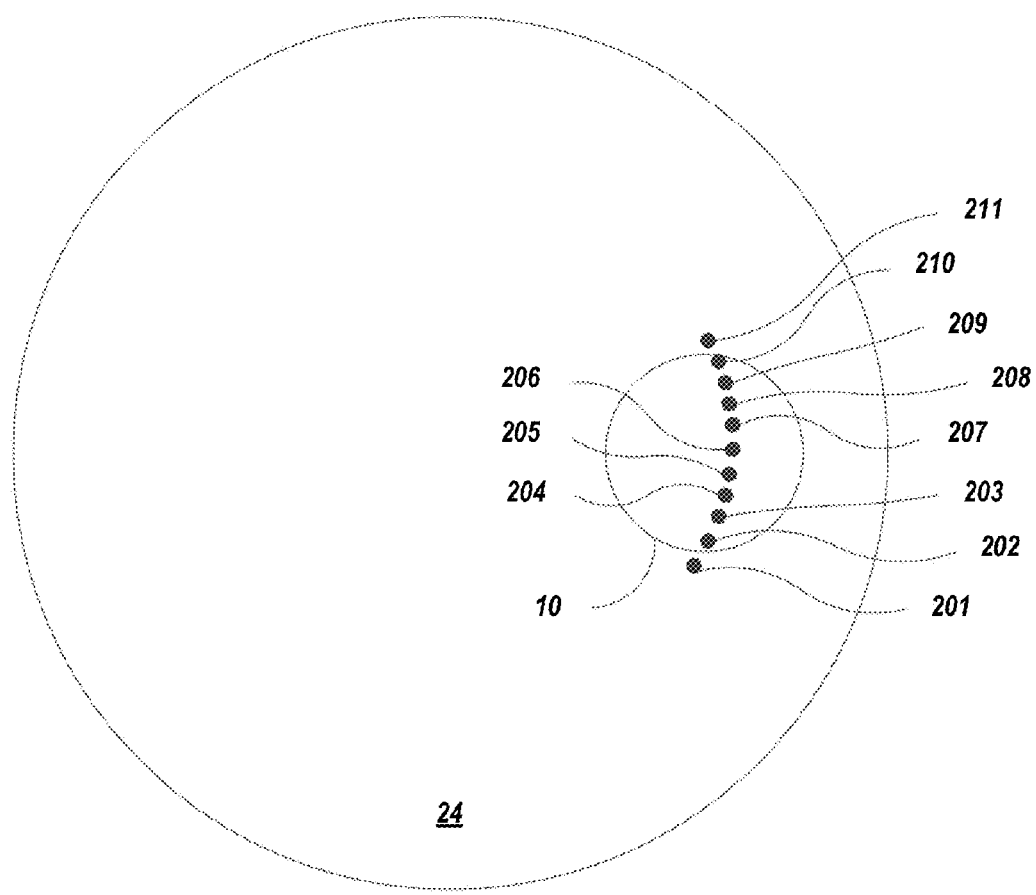
FIG. 2 is an overhead view of a polishing pad and shows locations where in-situ measurements are taken.

The light source 51 and light detector 52 are connected to a computing device operable to control their operation and to receive their signals. The computing device can include a microprocessor situated near the polishing apparatus, e.g., a personal computer. With respect to control, the computing device can, for example, synchronize activation of the light source 51 with the rotation of the platen 24. As shown in FIG. 2, the computer can cause the light source 51 to emit a series of flashes starting just before and ending just after the substrate 10 passes over the in-situ monitoring module 50. Each of points 201-211 represents a location where light from the in-situ monitoring module 50 impinged upon and reflected off of the substrate 10. Alternatively, the computer can cause the light source 51 to emit light continuously starting just before and ending just after the substrate 10 passes over the in-situ monitoring module 50.

The spectra obtained as polishing progresses, e.g., from successive sweeps of the sensor in the platen across the substrate, provide a sequence of spectra. In some implementations, the light source 51 emits a series of flashes of light onto multiple portions of the substrate 10. For example, the light source can emit flashes of light onto a center portion of the substrate 10 and an exterior portion of the substrate 10. Light reflected off of the substrate 10 can be received by the light detector 52 in order to determine multiple sequences of spectra from multiple portions of the substrate 10. Features can be identified, in the spectra where each feature is associated with one portion of the substrate 10. The features can be used, for example, in determining an endpoint condition for polishing of the substrate 10. In some implementations, monitoring of multiple portions of the substrate 10 allows for changing the polishing rate on one or more of the portions of the substrate 10.

Figure 3A:
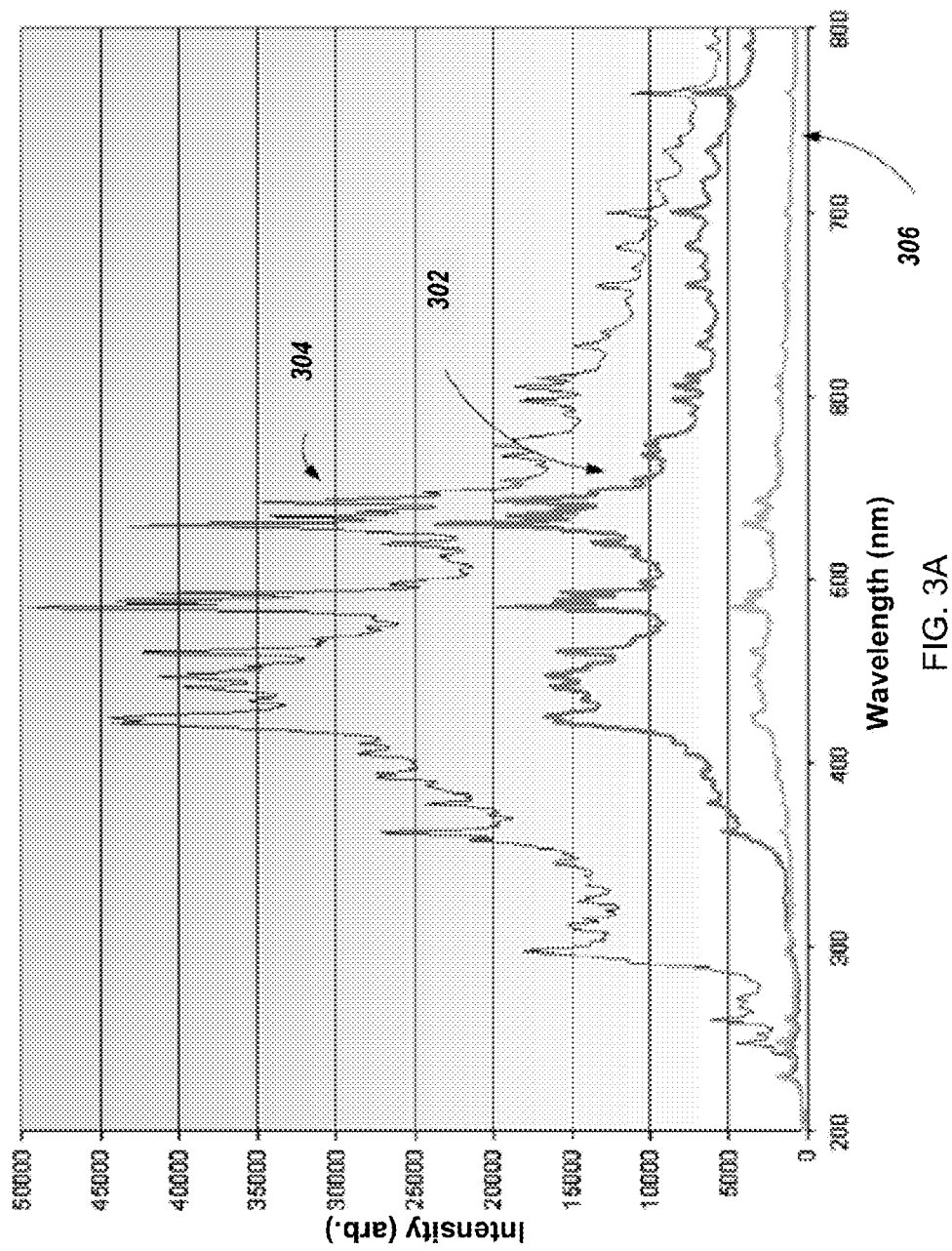
FIG. 3A shows a spectrum obtained from in-situ measurements.

With respect to receiving signals, the computing device can receive, for example, a signal that carries information describing a spectrum of the light received by the light detector 52. FIG. 3A shows examples of a spectrum measured from light that is emitted from a single flash of the light source and that is reflected from the substrate. Spectrum 302 is measured from light reflected from a product substrate. Spectrum 304 is measured from light reflected from a base silicon substrate (which is a wafer that has only a silicon layer). Spectrum 306 is from light received by the optical head 53 when there is no substrate situated over the optical head 53. Under this condition, referred to in the present specification as a dark condition, the received light is typically ambient light.

Figure 3B:
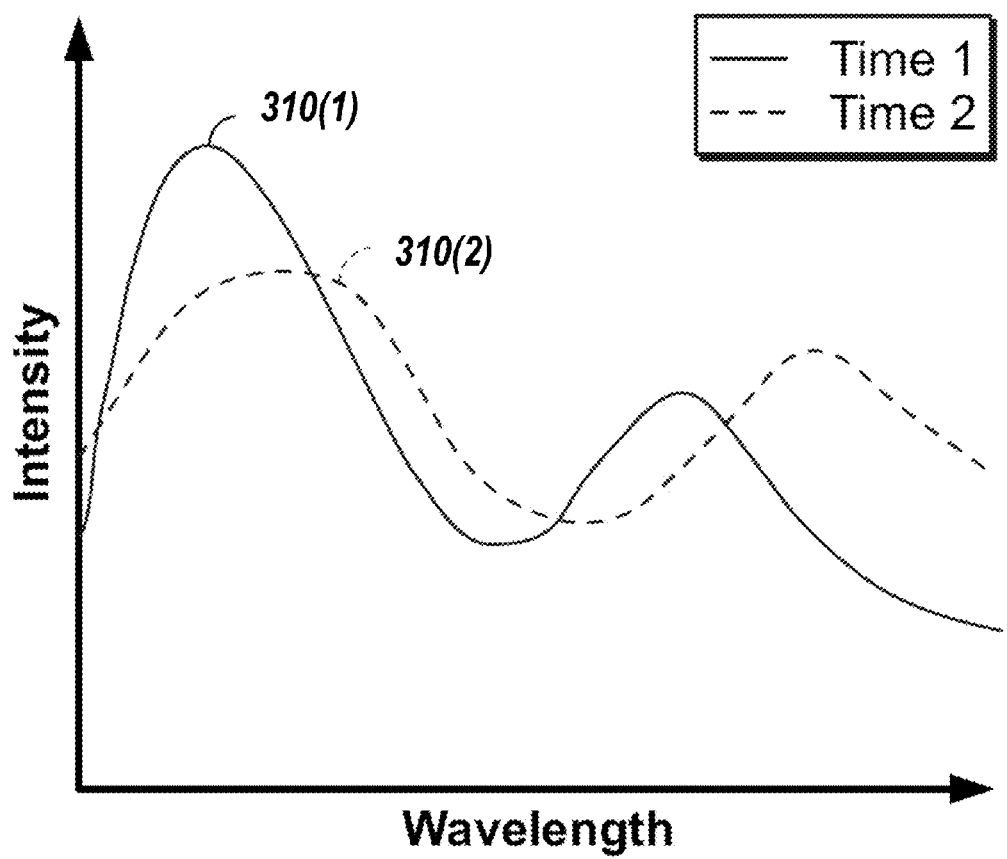
FIG. 3B illustrates the evolution of spectra obtained from in-situ measurements as polishing progresses.

The computing device can process the above-described signal, or a portion thereof, to determine an endpoint of a polishing step. Without being limited to any particular theory, the spectrum of light reflected from the substrate 10 evolves as polishing progresses. FIG. 3B provides an example of the evolution of the spectrum as polishing of a film of interest progresses. The different lines of spectrum represent different times in the polishing. As can be seen, properties of the spectrum of the reflected light change as a thickness of the film changes, and particular spectrums are exhibited by particular thicknesses of the film. When a peak (that is, a local maximum) in the spectrum of reflected light is observed as the polishing of a film progresses, the height of the peak typically changes, and the peak tends to grow wider as material is removed. In addition to widening, the wavelength at which a particular peak is located typically increases as polishing progresses. In some implementations, the wavelength at which a particular peak is located typically decreases as polishing progresses. For example, peak 310(1) illustrates a peak in the spectrum at a certain time during polishing, and peak 310(2) illustrates the same peak at a later time during polishing. Peak 310(2) is located at a longer wavelength and is wider than peak 310(1).

The relative change in the wavelength and/or width of a peak (e.g., the width measured at a fixed distance below the peak or measured at a height halfway between the peak and the nearest valley), the absolute wavelength and/or width of the peak, or both can be used to determine the endpoint for polishing according to an empirical formula. The best peak (or peaks) to use when determining the endpoint varies depending on what materials are being polished and the pattern of those materials.

In some implementations, a change in peak wavelength can be used to determine endpoint. For example, when the difference between the starting wavelength of a peak and the current wavelength of the peak reaches a target difference, the polishing apparatus 20 can stop polishing the substrate 10. Alternatively, features other than peaks can be used to determine a difference in the wavelength of light reflected from the substrate 10. For example, the wavelength of a valley, an inflection point, or an x- or y-axis intercept can be monitored by the light detector 52, and when the wavelength has changed by a predetermined amount, the polishing apparatus 20 can stop polishing the substrate 10.

In some implementations, the characteristic that is monitored is the width or the intensity of the feature instead of, or in addition to the wavelength. Features can shift on the order of 40 nm to 120 nm, although other shifts are possible, For example, the upper limit could be much greater, especially in the case of a dielectric polish.

FIG. 4A provides an example of a measured spectrum 400a of light reflected from the substrate 10. The optical monitoring system can pass the spectrum 400a through a high-pass filter in order to reduce the overall slope of the spectrum, resulting in a spectrum 400b shown in FIG. 4B. During processing of multiple substrates in a batch, for example, large spectra differences can exist among wafers. A high-pass filter can be used to normalize the spectra in order to reduce spectra variations across substrates in the same batch. An exemplary high-pass filter can have a cutoff of 0.005 Hz and a filter order of 4. The high-pass filter is not only used to help filter out sensitivity to underlying variation, but also to "flatten" out the legitimate signal to make feature tracking easier.

Figures 5A, 5B:
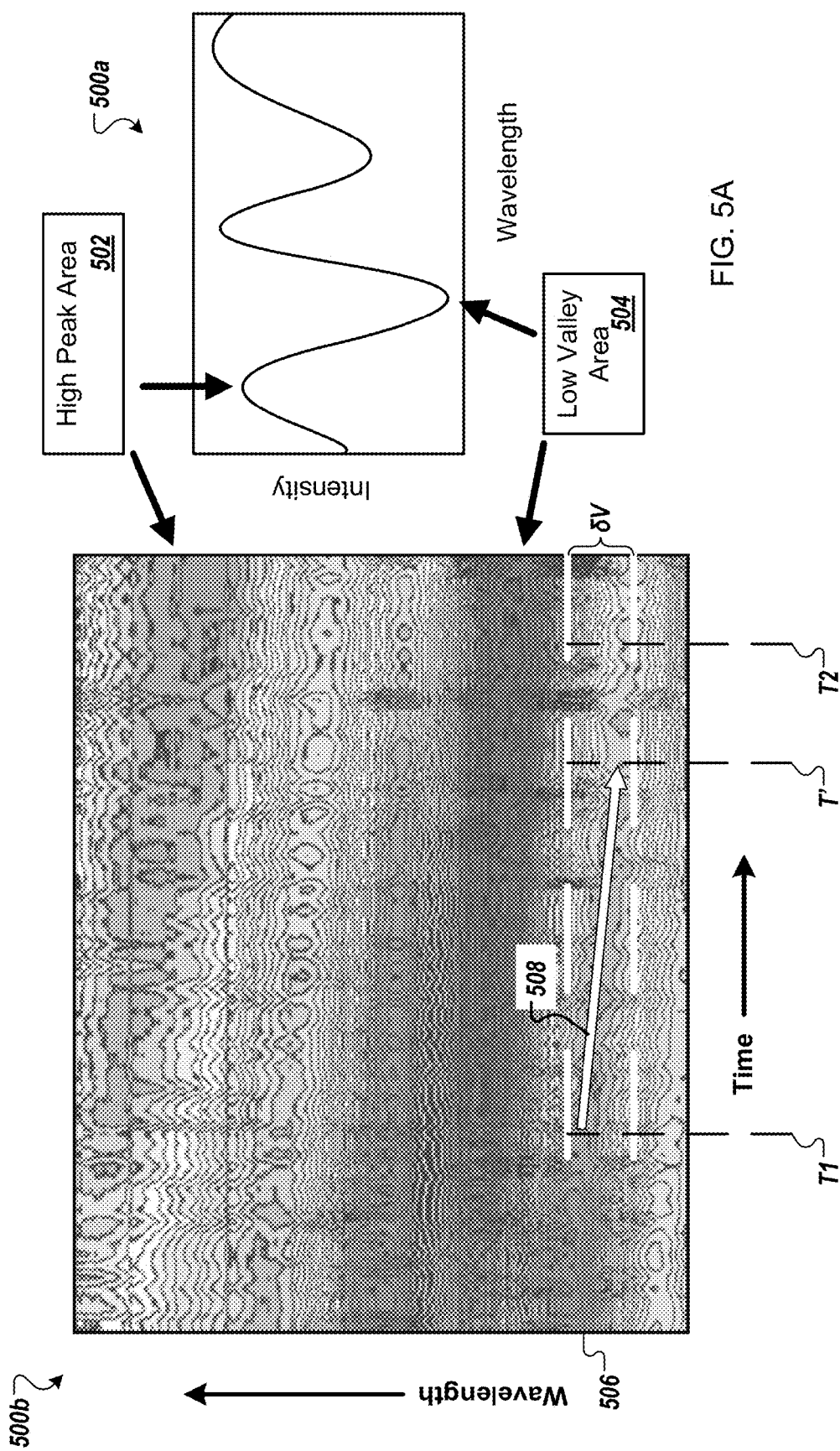
FIG. 5A shows a spectrum of light reflected from a substrate.
FIG. 5B shows a contour plot of spectra obtained from in-situ measurements of light reflected from a substrate.

In order for a user to select which feature of the endpoint to track to determine the endpoint, a contour plot can be generated and displayed to the user. FIG. 5B provides an example of a contour plot 500b generated from multiple spectra measurements of light reflected off of the substrate 10 during polishing, and FIG. 5A provides an example of a measured spectrum 500a from a particular moment in the contour plot 500b. The contour plot 500b includes features, such as a peak area 502 and a valley area 504 which result from associated peaks 502 and valleys 504 on the spectrum 500a. As time progresses, the substrate 10 is polished and the light reflected from the substrate changes, as shown by changes to the spectral features in the contour plot 500b.

In order to generate the contour plot 500b, a test substrate can be polished, and the light reflected from the test substrate can be measured by the light detector 52 during polishing to generate a sequence of spectra of light reflected from the substrate 10. The sequence of spectra can be stored, e.g., in a computer system, which optionally can be part of the optical monitoring system. Polishing of the set up substrate can start at time T1 and continue past an estimated endpoint time.

When polishing of the test substrate is complete, the computer renders the contour plot 500b for presentation to an operator of the polishing apparatus 20, e.g., on a computer monitor. In some implementations, the computer color-codes the contour-plot, e.g., by assigning red to the higher intensity values in the spectra, blue to the lower intensity values in the spectra, and intermediate colors (orange through green) to the intermediate intensity values in the spectra. In other implementations, the computer creates a grayscale contour plot by assigning the darkest shade of gray to lower intensity values in the spectra, and the lightest shade of gray to higher intensity values in the spectra, with intermediate shades for the intermediate intensity values in the spectra. Alternatively, the computer can generate a 3-D contour plot with the largest z value for higher intensity values in the spectra, and the smallest z value for lower intensity values in the spectra, with intermediate z values for the intermediate values in the spectra. A 3-D contour plot can be, for example, displayed in color, grayscale, or black and white. In some implementations, the operator of the polishing apparatus 20 can interact with a 3-D contour plot in order to view different features of the spectra.

The contour plot 500b of the reflected light generated from monitoring of the test substrate during polishing can contain, for example, spectral features such as peaks, valleys, spectral zero-crossing points, and inflection points. The features can have characteristics such as wavelengths, widths, and/or intensities. As shown by the contour plot 500b, as the polishing pad 30 removes material from the top surface of the set up substrate, the light reflected off of the set up substrate can change over time, so feature characteristics change over time.

Prior to polishing of the device substrates, an operator of the polishing apparatus 20 can view the contour plot 500b and select a feature characteristic to track during processing of a batch of substrates that have similar die features as the set up substrate. For example, the wavelength of a peak 506 can be selected for tracking by the operator of the polishing apparatus 20. A potential advantage of the contour plot 500b, particularly a color-coded or 3-D contour plot, is that such a graphical display makes the selection of a pertinent feature by the user easier, since the features, e.g., features with characteristics that change linearly with time, are easily visually distinguishable.

In order to select an endpoint criterion, the characteristic of the selected feature can be calculated by linear interpolation based on the pre-polish thickness and the post-polish thickness of the test substrate. For example, thicknesses D1 and D2 of the layer on the test substrate can be measured at pre-polish (e.g., the thickness of the test substrate before time T1 when polishing starts) and at post-polish (e.g., the thickness of the test substrate after time T2 when polishing ends) respectively, and the values of the characteristic can be measured at the time T' at which the target thickness D' is achieved. T' can be calculated from $T'=T1+(T2-T1)*(D2-D')/(D2-D1)$, and the value V' of the characteristic can be determined from the spectrum measured at time T'. A target difference, $\delta V$, for the characteristic of the selected feature, such as a specific change in the wavelength of the peak 506, can be determined from $V'=V1$, where V1 is the initial characteristic value (at the time T1). Thus, the target difference $\delta V$ can be the change from the initial value of the characteristic V1 before polishing at time T1 to the value of the characteristic V' at time T' when polishing is expected to be completed. An operator of the polishing apparatus 20 can enter a target difference 604 (e.g., $\delta V$) for the feature characteristic to change into a computer associated with the polishing apparatus 20.

In order to determine the value of V' which in turn determines the value of points 602, a robust line fitting can be used to fit a line 508 to the measured data. The value of line 508 at time T' minus the value of line 508 at T1 can be used to determine points 602.

The feature, such as the spectral peak 506, can be selected based on correlation between the target difference of the feature characteristic and the amount of material removed from the set up substrate during polishing. The operator of the polishing apparatus 20 can select a different feature and/or feature characteristic in order to find a feature characteristic with a good correlation between the target difference of the characteristic and the amount of material removed from the set up substrate.

In other implementations, endpoint determination logic determines the spectral feature to track and the endpoint criterion.

Figure 6B:
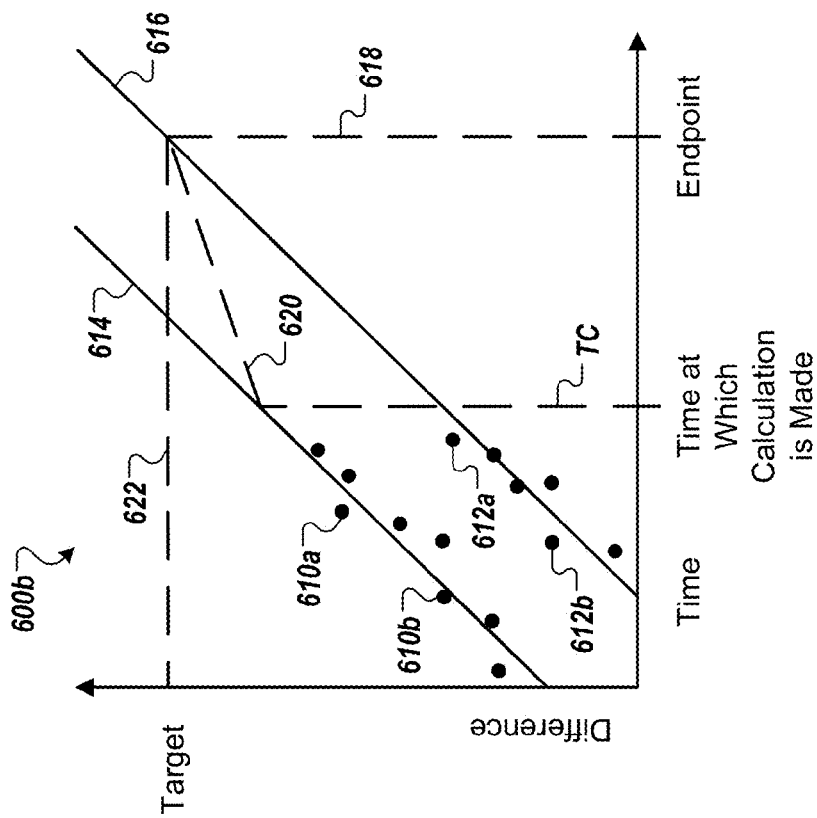
FIG. 6B shows an example graph of polishing progress, measured in characteristic difference versus time in which characteristics of two different features are measured in order to adjust the polishing rate of a substrate.
Figure 6A:
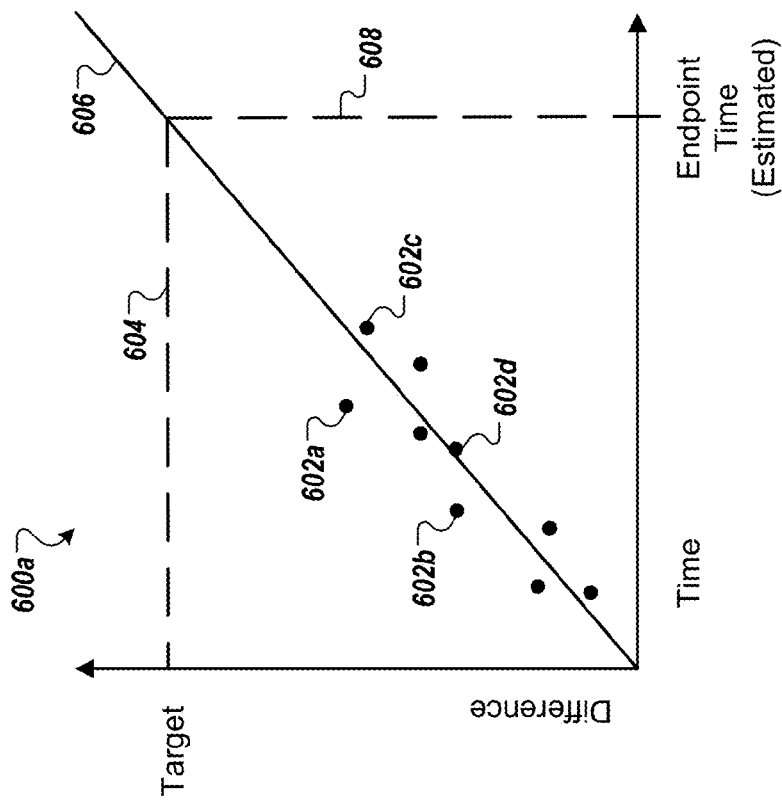
FIG. 6A shows an example graph of polishing progress, measured in characteristic difference versus time.

Turning now to the polishing of a device substrate, FIG. 6A is an example graph 600a of difference values 602a-d of a tracked feature characteristic during polishing of a device substrate 10. The substrate 10 can be part of a batch of substrates being polished where an operator of the polishing apparatus 20 selected a feature characteristic, such as the wavelength of a peak or a valley, to track from the contour plot 500b of a set up substrate.

As the substrate 10 is polished, the light detector 52 measures spectra of light reflected from the substrate 10. The endpoint determination logic uses the spectra of light to determine a sequence of values for the feature characteristic. The values of the selected feature characteristic can change as material is removed from the surface of the substrate 10. The difference between the sequence of values of the feature characteristic and the initial value of the feature characteristic V1 is used to determine the difference values 602a-d.

As the substrate 10 is polished the endpoint determination logic can determine the current value of the feature characteristic being tracked. In some implementations, when the current value of the feature has changed from the initial value by the target difference 604, endpoint can be called. In some implementations, a line 606 is fit to the difference values 602a-d, e.g., using a robust line fit. A function of the line 606 can be determined based on the difference values 602a-d in order to predict polishing endpoint time. In some implementations, the function is a linear function of time versus characteristic difference. The function of the line 606, e.g., the slope and intersects, can change during polishing of the substrate 10 as new difference values are calculated. In some implementations, the time at which the line 606 reaches the target difference 604 provides an estimated endpoint time 608. As the function of the line 606 changes to accommodate new difference values, the estimated endpoint time 608 can change.

In some implementations, the function of the line 606 is used to determine the amount of material removed from the substrate 10 and a change in the current value determined by the function is used to determine when the target difference has been reached and endpoint needs to be called. Line 606 tracks amount of material removed. Alternatively, when removing a specific thickness of material from the substrate 10, a change in the current value determined by the function can be used to determine the amount of material removed from the top surface of the substrate 10 and when to call endpoint. For example, an operator can set the target difference to be a change in wavelength of the selected feature by 50 nanometers. For example, the change in the wavelength of a selected peak can be used to determine how much material has been removed from the top layer of the substrate 10 and when to call endpoint.

At time T1, before polishing of the substrate 10, the characteristic value difference of the selected feature is 0. As the polishing pad 30 begins to polish the substrate 10 the characteristic values of the identified feature can change as material is polished off of the top surface of the substrate 10. For example, during polishing the wavelength of the selected feature characteristic can move to a higher or lower wavelength. Excluding noise effects, the wavelength, and thus the difference in wavelength, of the feature tends to change monotonically, and often linearly. At time T' endpoint determination logic determines that the identified feature characteristic has changed by the target difference, $\delta V$, and endpoint can be called. For example, when the wavelength of the feature has changed by a target difference of 50 nanometers, endpoint is called and the polishing pad 30 stops polishing the substrate 10.

When processing a batch of substrates the optical monitoring system 50 can, for example, track the same spectral feature across all of the substrates. The spectral feature can be associated with the same die feature on the substrates. The starting wavelength of the spectral feature can change from substrate to substrate across the batch based on underlying variations of the substrates. In some implementations, in order to minimize variability across multiple substrates, endpoint determination logic can call endpoint when the selected feature characteristic value or a function fit to values of the feature characteristic changes by an endpoint metric, EM, instead of the target difference. The endpoint determination logic can use an expected initial value, EIV, determined from a set up substrate. At time T1 when the feature characteristic being tracked on the substrate 10 is identified, the endpoint determination logic determines the actual initial value, AIV, for a substrate being processed. The endpoint determination logic can use an initial value weight, IVW, to reduce the influence of the actual initial value on the endpoint determination while taking into consideration variations in substrates across a batch. Substrate variation can include, for example, substrate thickness or the thickness of underlying structures. The initial value weight can correlate to the substrate variations in order to increase uniformity between substrate to substrate processing. The endpoint metric can be, for example, determined by multiplying the initial value weight by the difference between the actual initial value and the expected initial value and adding the target difference, e.g., $EM=IVW*(AIV-EIV)+\delta V$.

In some implementations, a weighted combination is used to determine endpoint. For example, the endpoint determination logic can calculate an initial value of the characteristic from the function and a current value of the characteristic from the function, and a first difference between the initial value and the current value. The endpoint determination logic can calculate a second difference between the initial value and a target value and generate a weighted combination of the first difference and the second difference.

FIG. 6B is an example graph 600b of characteristic measurement differences versus time taken at two portions of the substrate 10. For example, the optical monitoring system 50 can track one feature located toward an edge portion of the substrate 10 and another feature located toward a center portion of the substrate 10 in order to determine how much material has been removed from the substrate 10. When testing a set up substrate, an operator of the polishing apparatus 20 can, for example, identify two features to track that correspond to different portions of the set up substrate. In some implementations, the spectral features correspond with the same type of die features on the set up substrate. In other implementations, the spectral features are associated with different types of die features on the set up substrate. As the substrate 10 is being polished, the light detector 52 can measure a sequence of spectra of reflected light from the two portions of the substrate 10 that correspond with the selected features of the set up substrate. A sequence of values associated with characteristics of the two features can be determined by endpoint determination logic. A sequence of first difference values 610a-b can be calculated for a feature characteristic in a first portion of the substrate 10 by subtracting the initial characteristic value from the current characteristic value as polishing time progresses. A sequence of second difference values 612a-b can similarly be calculated for a feature characteristic in a second portion of the substrate 10.

A first line 614 can be fit to the first difference values 610a-b and a second line 616 can be fit to the second difference values 612a-b. The first line 614 and the second line 616 can be determined by a first function and a second function, respectively, in order to determine an estimated polishing endpoint time 618 or an adjustment to the polishing rate 620 of the substrate 10.

During polishing, an endpoint calculation based on a target difference 622 is made at time TC with the first function for the first portion of the substrate 10 and with the second function for the second portion of the substrate. If the estimated endpoint time for the first portion of the substrate and the second portion of the substrate differ (e.g., the first portion will reach the target thickness before the second portion) an adjustment to the polishing rate 620 can be made so that the first function and the second function will have the same endpoint time 618. In some implementations, the polishing rates of both the first portion and the second portion of the substrate are adjusted so that endpoint is reached at both portions simultaneously. Alternatively, the polishing rate of either the first portion or the second portion can be adjusted.

The polishing rates can be adjusted by, for example, increasing or decreasing the pressure in a corresponding region of the carrier head 70. The change in polishing rate can be assumed to be directly proportional to the change in pressure, e.g., a simple Prestonian model. For example, when a the first region of the substrate 10 is projected to reach the target thickness at a time TA, and the system has established a target time TT, the carrier head pressure in the corresponding region before time T3 can be multiplied by TT/TA to provide the carrier head pressure after time T3. Additionally, a control model for polishing the substrates can be developed that takes into account the influences of platen or head rotational speed, second order effects of different head pressure combinations, the polishing temperature, slurry flow, or other parameters that affect the polishing rate. At a subsequent time during the polishing process, the rates can again be adjusted, if appropriate.

In some implementations, a computing device uses a wavelength range in order to easily identify a selected spectral feature in a measured spectrum of light reflected from the device substrate 10. The computing device searches the wavelength range for the selected spectral feature in order to distinguish the selected spectral feature from other spectral features that are similar to the selected spectral feature in the measured spectrum, e.g., in intensity, width, or wavelength.

Figure 7A:
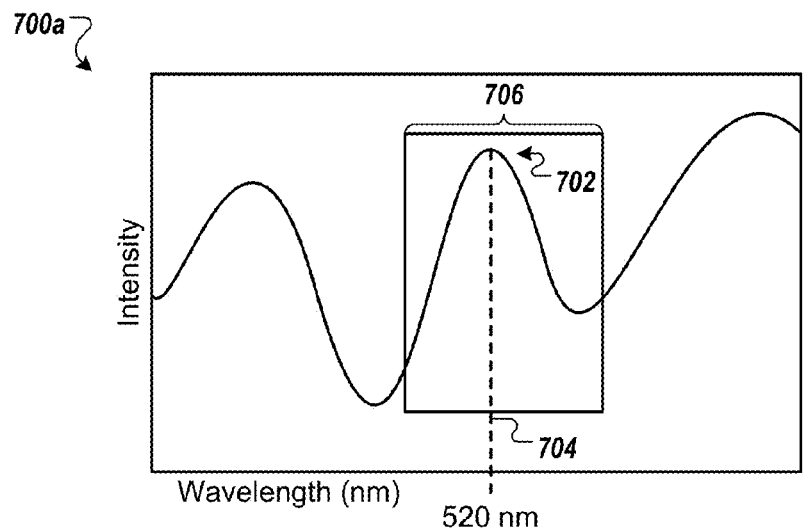
FIG. 7A shows another spectrum of light obtained from in-situ measurements.

FIG. 7A shows an example of a spectrum 700a measured from light received by the light detector 52. The spectrum 700a includes a selected spectral feature 702, e.g., a spectral peak. The selected spectral feature 702 can be selected by endpoint determination logic for tracking during CMP of the substrate 10. A characteristic 704 (e.g., the wavelength) of the selected spectral feature 702 can be identified by the endpoint determination logic. When the characteristic 704 has changed by a target difference, the endpoint determination logic calls endpoint.

In some implementations, the endpoint determination logic determines a wavelength range 706 over which to search for the selected spectral feature 702. The wavelength range 706 can have a width of between about 50 and about 200 nanometers. In some implementations, the wavelength range 706 is predetermined, e.g., specified by an operator, e.g., by receiving user input selecting the wavelength range, or specified as a process parameter for a batch of substrates, by retrieving the wavelength range from a memory associating the wavelength range with the batch of substrates. In some implementations, the wavelength range 706 is based on historical data, e.g., the average or maximum distance between consecutive spectrum measurements. In some implementations, the wavelength range 706 is based on information about a test substrate, e.g., twice the target difference $\delta V$.

Figure 7B:
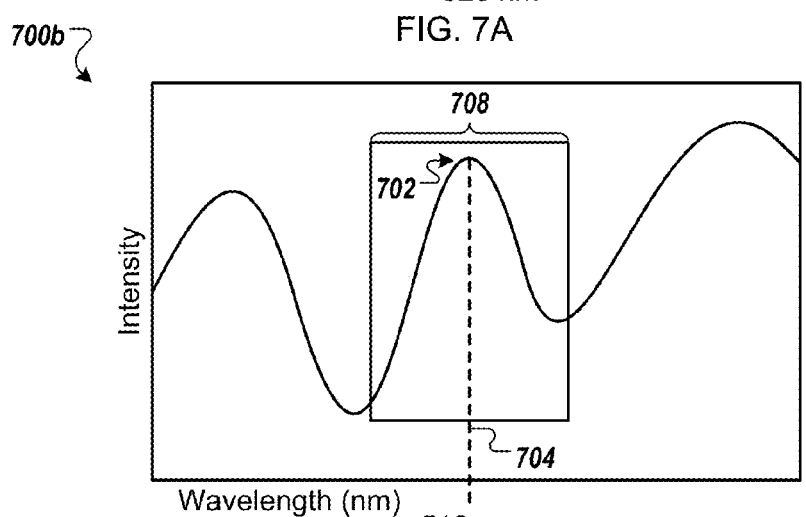
FIG. 7B shows a spectrum of light obtained after the spectrum of FIG. 7A.

FIG. 7B is an example of a spectrum 700b measured from light received by the light detector 52. For example, the spectrum 700b is measured during the rotation of the platen 24 directly after the spectrum 700a was taken. In some implementations, the endpoint determination logic determines the value of the characteristic 704 in the previous spectrum 700a (e.g., 520 nm) and adjusts the wavelength range 706 so that the center of a wavelength range 708 is positioned closer to the characteristic 704.

In some implementations, the endpoint determination logic uses the function of the line 606 to determine an expected current value of the characteristic 704. For example, the endpoint determination logic can use the current polishing time to determine the expected difference and determine the expected current value of the characteristic 704 by adding the expected difference to the initial value V1 of the characteristic 704. The endpoint determination logic can center the wavelength range 708 on the expected current value of the characteristic 704.

Figure 7C:
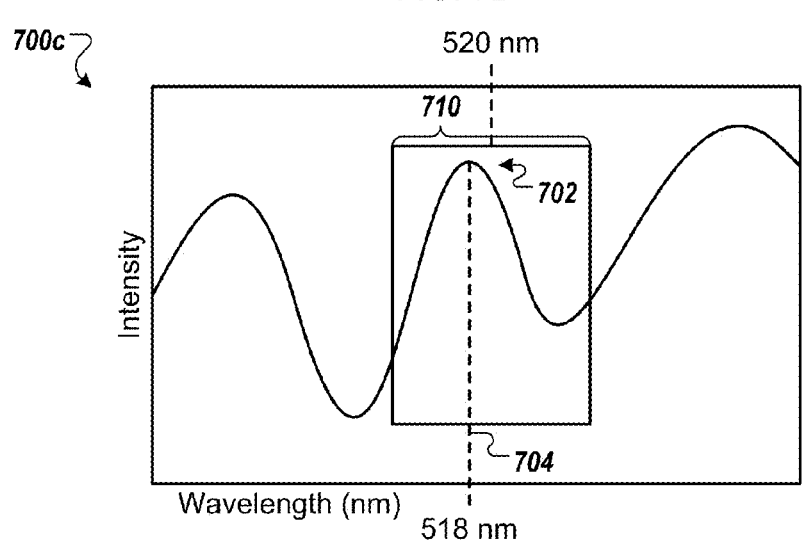
FIG. 7C shows another spectrum of light obtained after the spectrum of FIG. 7A.

FIG. 7C is another example of a spectrum 700c measured from light received by the light detector 52. For example, the spectrum 700c is measured during the rotation of the platen 24 directly after the spectrum 700a was taken. In some implementations, the endpoint determination logic uses the previous value of the characteristic 704 for the center of a wavelength range 710.

For example, the endpoint determination logic determines the average variance between values of the characteristic 704 determined during two consecutive passes of the optical head 53 below the substrate 10. The endpoint determination logic can set the width of the wavelength range 710 to twice the average variance. In some implementations, the endpoint determination logic uses the standard deviation of the variance between values of the characteristic 704 in determining the width of the wavelength range 710.

In some implementations, the width of the wavelength range 706 is the same for all spectra measurements. For example, the width of the wavelength range 706, the wavelength range 708, and the wavelength range 710 are the same. In some implementations, the widths of the wavelength ranges are different. For example, when the characteristic 704 is estimated to change by 2 nanometers from the previous measurement of the characteristic, the width of the wavelength range 708 is 60 nanometers. When the characteristic 704 is estimated to change by 5 nanometers from the previous measurement of the characteristic, the width of the wavelength range 708 is 80 nanometers, a greater wavelength range than the range for a smaller change in the characteristic.

In some implementations, the wavelength range 706 is the same for all spectra measurements during polishing of the substrate 10. For example, the wavelength range 706 is 475 nanometers to 555 nanometers and the endpoint determination logic searches for the selected spectral feature 702 in the wavelengths between 475 nanometers and 555 nanometers for all spectra measurements taken during polishing of the substrate 10, although other wavelength ranges are possible. The wavelength range 706 can be selected by user input as a subset of the full spectral range measured by the in-situ monitoring system.

In some implementations, the endpoint determination logic searches for the selected spectral feature 702 in a modified wavelength range in some of the spectra measurements and in a wavelength range used for a previous spectrum in remainder of the spectra. For example, the endpoint determination logic searches for the selected spectral feature 702 in the wavelength range 706 for a spectrum measured during a first rotation of the platen 24 and the wavelength range 708 for a spectrum measured during a consecutive rotation of the platen 24, where both measurements were taken in a first area of the substrate 10. Continuing the example, the endpoint determination logic searches for another selected spectral feature in the wavelength range 710 for two spectra measured during the same platen rotations, where both measurements were taken in a second area of the substrate 10 that is different from the first area.

In some implementations, the selected spectral feature 702 is a spectral valley or a spectral zero-crossing point. In some implementations, the characteristic 704 is an intensity or a width of a peak or valley (e.g., the width measured at a fixed distance below the peak or measured at a height halfway between the peak and the nearest valley).

Figures 8, 9:
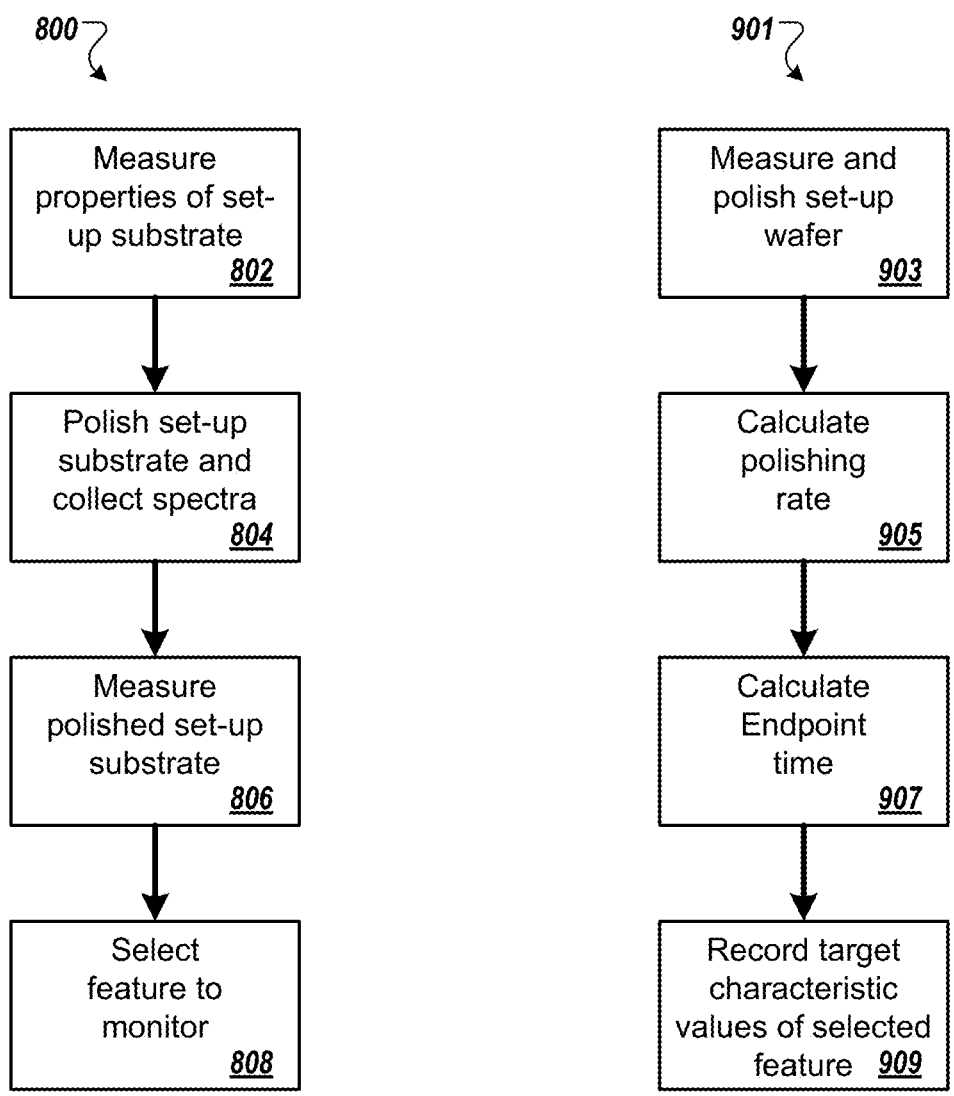
FIG. 8 shows a method for selecting a peak to monitor.
FIG. 9 shows a method for obtaining target parameters for the selected peak.

FIG. 8 shows a method 800 for selecting a target difference $\delta V$ to use when determining the endpoint for the polishing process. Properties of a substrate with the same pattern as the product substrate are measured (step 802). The substrate which is measured is referred to in the instant specification as a "set-up" substrate. The set-up substrate can simply be a substrate which is similar to or the same as the product substrate, or the set-up substrate can be one substrate from a batch of product substrates. The properties that are measured can include a pre-polished thickness of a film of interest at a particular location of interest on the substrate. Typically, the thicknesses at multiple locations are measured. The locations are usually selected so that a same type of die feature is measured for each location. Measurement can be performed at a metrology station. The in-situ optical monitoring system can measure a spectrum of light reflected off of the substrate before polishing.

The set-up substrate is polished in accordance with a polishing step of interest and the spectra obtained during polishing are collected (step 804). Polishing and spectral collection can be performed at the above described-polishing apparatus. The spectra are collected by the in-situ monitoring system during polishing. The substrate is overpolished, i.e., polished past an estimated endpoint, so that the spectrum of the light that is reflected from the substrate when the target thickness is achieved can be obtained.

Properties of the overpolished substrate are measured (step 806). The properties include post-polished thicknesses of the film of interest at the particular location or locations used for the pre-polish measurement.

The measured thicknesses and the collected spectra are used to select, by examining the collected spectra, a particular feature, such as a peak or a valley, to monitor during polishing (step 808). The feature can be selected by an operator of the polishing apparatus or the selection of the feature can be automated (e.g., based on conventional peak-finding algorithms and an empirical peak-selection formula). For example, the operator of the polishing apparatus 20 can be presented with the contour plot 500b and the operator can select a feature to track from the contour plot 500b as described above with reference to FIG. 5B. If a particular region of the spectrum is expected to contain a feature that is desirable to monitor during polishing (e.g., due to past experience or calculations of feature behavior based on theory), only features in that region need be considered. A feature is typically selected that exhibits a correlation between the amount of material removed from the top of the set-up substrate as the substrate is polished.

Linear interpolation can be performed using the measured pre-polish film thickness and post-polish substrate thickness to determine an approximate time that the target film thickness was achieved. The approximate time can be compared to the spectra contour plot in order to determine the endpoint value of the selected feature characteristic. The difference between the endpoint value and the initial value of the feature characteristic can be used as a target difference. In some implementations, a function is fit to the values of the feature characteristic in order to normalize the values of the feature characteristic. The difference between the endpoint value of the function and the initial value of the function can be used as the target difference. The same feature is monitored during the polishing of the rest of the batch of substrates.

Optionally, the spectra are processed to enhance accuracy and/or precision. The spectra can be processed, for example: to normalize them to a common reference, to average them, and/or to filter noise from them. In one implementation, a low-pass filter is applied to the spectra to reduce or eliminate abrupt spikes.

The spectral feature to monitor typically is empirically selected for particular endpoint determination logic so that the target thickness is achieved when the computer device calls an endpoint by applying the particular feature-based endpoint logic. The endpoint determination logic uses the target difference in feature characteristic to determine when an endpoint should be called. The change in characteristic can be measured relative to the initial characteristic value of the feature when polishing begins. Alternatively, the endpoint can be called relative to an expected initial value, EIV, and an actual initial value, AIV, in addition to the target difference, $\delta V$. The endpoint logic can multiply the difference between the actual initial value and the expected initial value by a start value weight, SVW, in order to compensate for underlying variations from substrate to substrate. For example, the endpoint determination logic can end polishing when an endpoint metric, $EM = SVW*(AIV - EIV) + \delta V$.

In some implementations, a weighted combination is used to determine endpoint. For example, the endpoint determination logic can calculate an initial value of the characteristic from the function and a current value of the characteristic from the function, and a first difference between the initial value and the current value. The endpoint determination logic can calculate a second difference between the initial value and a target value and generate a weighted combination of the first difference and the second difference. Endpoint can be called with the weighted value reaches a target value. The endpoint determination logic can determine when an endpoint should be called by comparing the monitored difference (or differences) to a target difference of the characteristic. If the monitored difference matches or is beyond the target difference, an endpoint is called. In one implementation the monitored difference must match or exceed the target difference for some period of time (e.g., two revolutions of the platen) before an endpoint is called.

FIG. 9 shows a method 901 for choosing target values of characteristics associated with the selected spectral feature for a particular target thickness and particular endpoint determination logic. A set-up substrate is measured and polished as described above in steps 802-806 (step 903). In particular, spectra are collected and the time at which each collected spectrum is measured is stored.

A polishing rate of the polishing apparatus for the particular set-up substrate is calculated (step 905). The average polishing rate PR can be calculated by using the pre- and post-polished thicknesses D1, D2, and the actual polish time, PT, e.g., PR=(D2−D1)/PT.

An endpoint time is calculated for the particular set-up substrate (step 907) to provide a calibration point to determine target values of the characteristics of the selected feature, as discussed below. The endpoint time can be calculated based on the calculated polish rate PR, the pre-polish starting thickness of the film of interest, ST, and the target thickness of the film of interest, TT. The endpoint time can be calculated as a simple linear interpolation, assuming that the polishing rate is constant through the polishing process, e.g., ET=(ST−TT)/PR.

Optionally, the calculated endpoint time can be evaluated by polishing another substrate of the batch of patterned substrates, stopping polishing at the calculated endpoint time, and measuring the thickness of the film of interest. If the thickness is within a satisfactory range of the target thickness, then the calculated endpoint time is satisfactory. Otherwise, the calculated endpoint time can be re-calculated.

Target characteristic values for the selected feature are recorded from the spectrum collected from the set-up substrate at the calculated endpoint time (step 909). If the parameters of interest involve a change in the selected feature's location or width, that information can be determined by examining the spectra collected during the period of time that preceded the calculated endpoint time. The difference between the initial values and the target values of the characteristics are recorded as the target differences for the feature. In some implementations, a single target difference is recorded.

Figure 10:
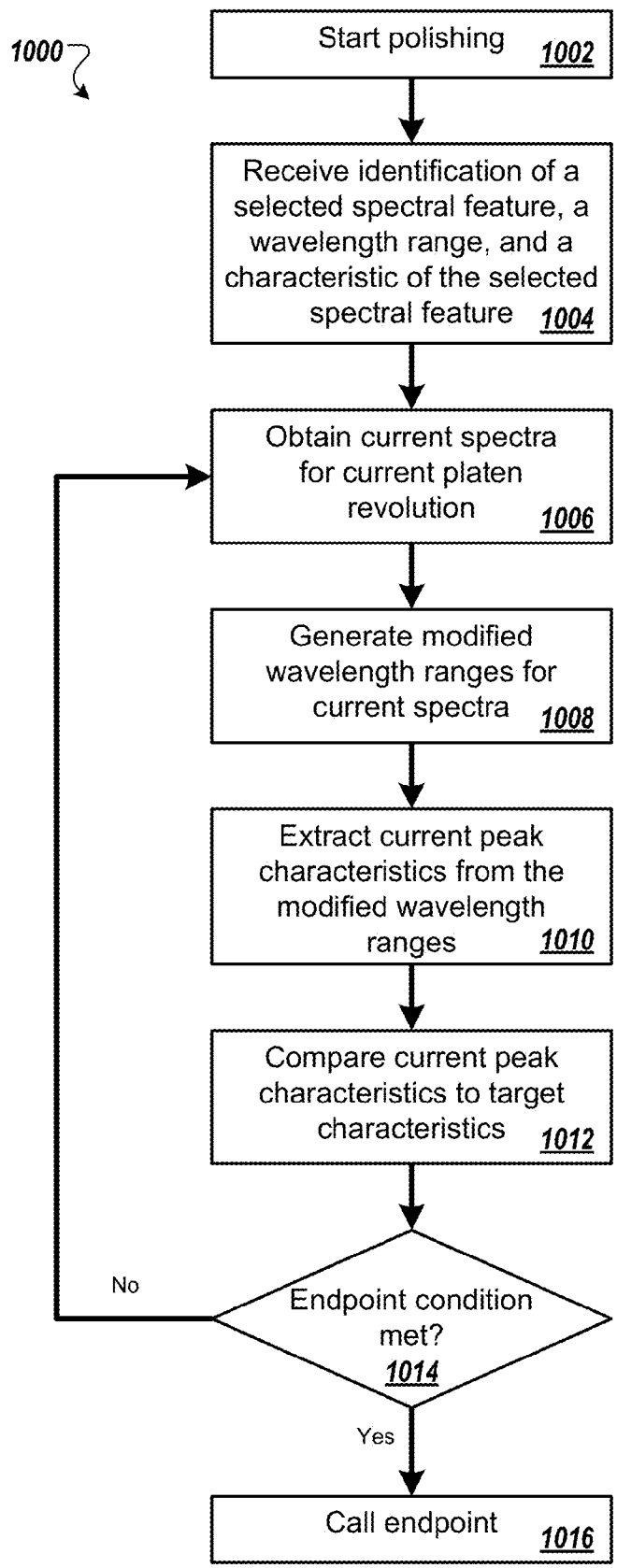
FIG. 10 shows a method for endpoint determination.

FIG. 10 shows a method 1000 for using peak-based endpoint determination logic to determine an endpoint of a polishing step. Another substrate of the batch of patterned substrates is polished using the above-described polishing apparatus (step 1002).

An identification of a selected spectral feature, a wavelength range, and a characteristic of the selected spectral feature are received (step 1004). For example, the endpoint determination logic receives the identification from a computer with processing parameters for the substrate. In some implementations, the processing parameters are based on information determined during processing of a set-up substrate.

The substrate is initially polished, light reflecting from the substrate is measured to create a spectrum, and a characteristic value of the selected spectral feature is determined in the wavelength range of the measured spectrum. At each revolution of the platen, the following steps are performed.

One or more spectra of light reflecting off a substrate surface being polished are measured to obtain one or more current spectra for a current platen revolution (step 1006). The one or more spectra measured for the current platen revolution are optionally processed to enhance accuracy and/or precision as described above in reference to FIG. 8. If only one spectrum is measured, then the one spectrum is used as the current spectrum. If more than one current spectrum is measured for a platen revolution, then they are grouped, averaged within each group, and the averages are designated to be current spectra. The spectra can be grouped by radial distance from the center of the substrate.

By way of example, a first current spectrum can be obtained from spectra measured at points 202 and 210 (FIG. 2), a second current spectrum can be obtained from spectra measured at points 203 and 209, a third current spectra can be obtained from spectra measured at points 204 and 208, and so on. The characteristic values of the selected spectral peak can be determined for each current spectrum, and polishing can be monitored separately in each region of the substrate. Alternatively, worst-case values for the characteristics of the selected spectral peak can be determined from the current spectra and used by the endpoint determination logic.

During each revolution of the platen, an additional spectrum or spectra are added to the sequence of spectra for the current substrate. As polishing progresses at least some of the spectra in the sequence differ due to material being removed from the substrate during polishing.

Modified wavelength ranges for the current spectra are generated (step 1008) as described above with reference to FIGS. 7A-C. For example, the endpoint logic determines modified wavelength ranges for the current spectra based on previous characteristic values. The modified wavelength ranges can be centered on the previous characteristic values. In some implementations, the modified wavelength ranges are determined based on expected characteristic values, e.g., the center of the wavelength ranges coincide with the expected characteristic values.

In some implementations, some of the wavelength ranges for the current spectra are determined using different methods. For example, a wavelength range for a spectrum measured from light reflected in an edge area of the substrate is determined by centering the wavelength range on the characteristic value from the previous spectrum measured in the same edge area of the substrate. Continuing the example, a wavelength range for a spectrum measured from light reflected in a center area of the substrate is determined by centering the wavelength range on the expected characteristic value for the center area.

In some implementations, the widths of the wavelength ranges for the current spectra are the same. In some implementations, some of the widths of the wavelength ranges for the current spectra are different.

Identification of a wavelength range to search for selected spectral feature characteristics can allow greater accuracy in detection of endpoint or determination of a polishing rate change, e.g., the system is less likely to select an incorrect spectral feature during subsequent spectra measurements.

Tracking spectral features in a wavelength range instead across an entire spectrum allows the spectral features to be more easily and quickly identified. Processing resources needed to identify the selected spectral features can be reduced Current characteristic values for the selected peak are extracted from the modified wavelength ranges (step 1010), and the current characteristic values are compared to the target characteristic values (step 1012) using the endpoint determination logic discussed above in the context of FIG. 8. For example, a sequence of values for the current feature characteristic is determined from the sequence of spectra and a function is fit to the sequence of values. The function can be, for example, a linear function that can approximate the amount of material removed from the substrate during polishing based on the difference between the current characteristic value and the initial characteristic value.

As long as the endpoint determination logic determines that the endpoint condition has not been met ("no" branch of step 1014), polishing is allowed to continue, and steps 1006, 1008, 1010, 1012, and 1014 are repeated as appropriate. For example, endpoint determination logic determines, based on the function, that the target difference for the feature characteristic has not yet been reached.

In some implementations, when spectra of reflected light from multiple portions of the substrate are measured, the endpoint determination logic can determine that the polishing rate of one or more portions of the substrate needs to be adjusted so that polishing of the multiple portions is completed at, or closer to the same time.

When the endpoint determination logic determines that the endpoint condition has been met ("yes" branch of step 1014), an endpoint is called, and polishing is stopped (step 1016).

Spectra can be normalized to remove or reduce the influence of undesired light reflections. Light reflections contributed by media other than the film or films of interest include light reflections from the polishing pad window and from the base silicon layer of the substrate. Contributions from the window can be estimated by measuring the spectrum of light received by the in-situ monitoring system under a dark condition (i.e., when no substrates are placed over the in-situ monitoring system). Contributions from the silicon layer can be estimated by measuring the spectrum of light reflecting of a bare silicon substrate. The contributions are usually obtained prior to commencement of the polishing step. A measured raw spectrum is normalized as follows:

normalized spectrum=($A$−Dark)/(Si−Dark)

where $A$ is the raw spectrum, Dark is the spectrum obtained under the dark condition, and Si is the spectrum obtained from the bare silicon substrate.

In the described embodiment, the change of a wavelength peak in the spectrum is used to perform endpoint detection. The change of a wavelength valley in the spectrum (that is, local minima) also can be used, either instead of the peak or in conjunction with the peak. The change of multiple peaks (or valleys) also can be used when detecting the endpoint. For example, each peak can be monitored individually, and an endpoint can be called when a change of a majority of the peaks meet an endpoint condition. In other implementations, the change of an inflection point or a spectral zero-crossing can be used to determine endpoint detection.

Figure 11:
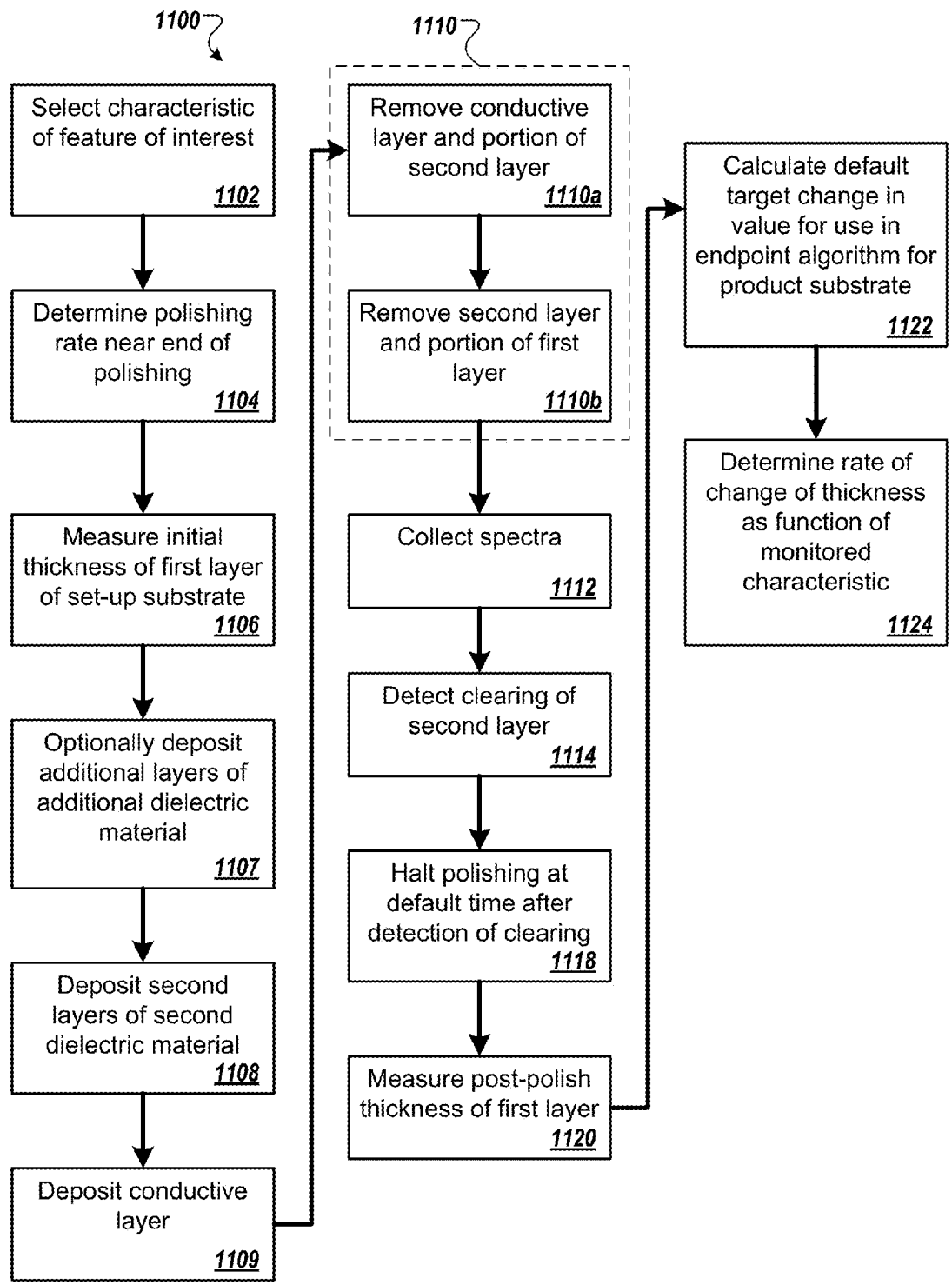
FIG. 11 shows a method of setting for endpoint detection.
Figure 12:
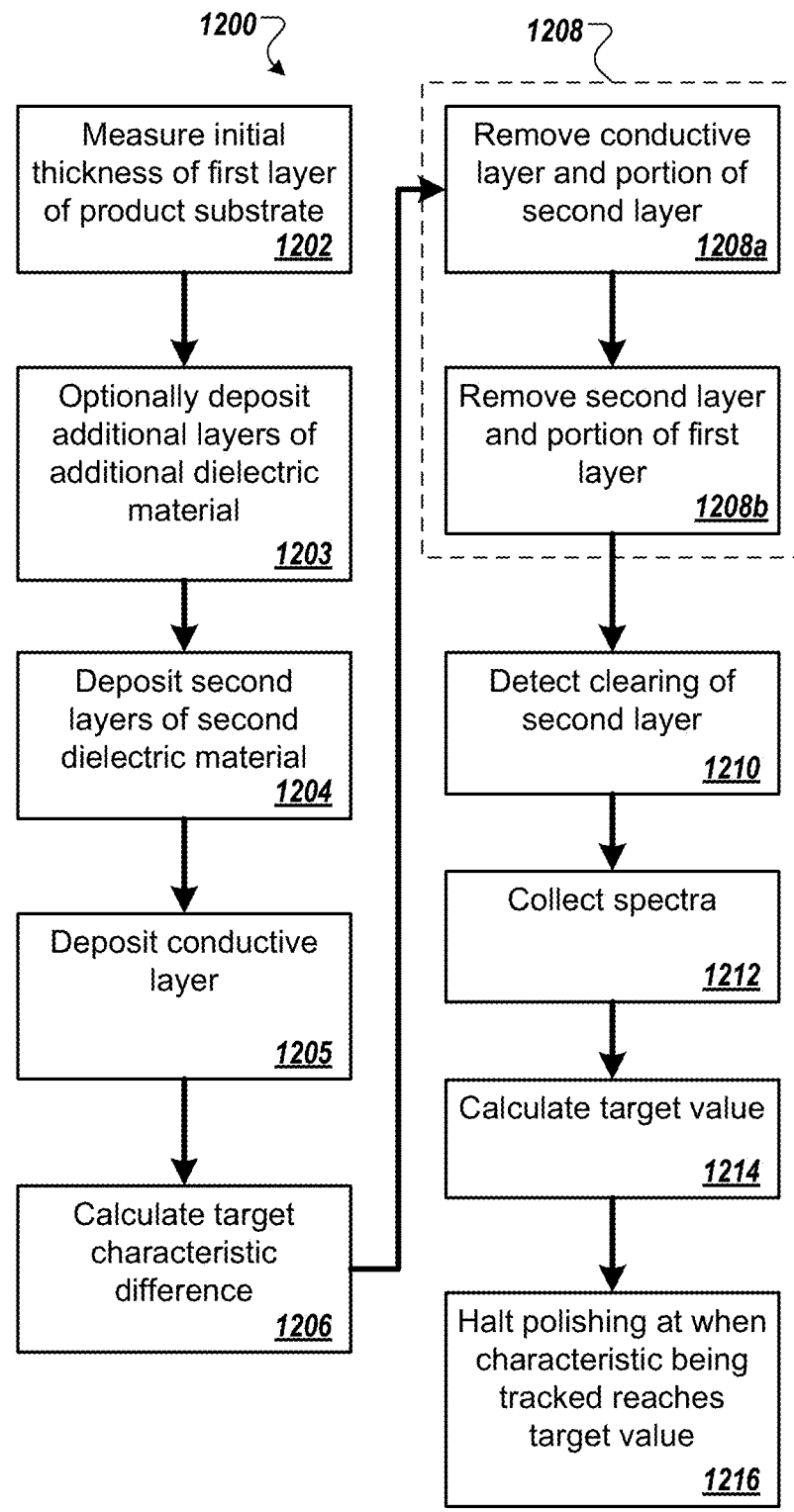
FIG. 12 shows another method for endpoint determination.

In some implementations, an algorithm set-up process 1100 (FIG. 11) is followed by polishing of one or more substrate(s) using a triggered feature tracking technique 1200 (FIG. 12).

Initially, a characteristic of a feature of interest in a spectrum is selected for use in tracking polishing of a first layer (step 1102), e.g., using one of the techniques described above. For example, the feature can be a peak or valley, and the characteristic can be a position or width in wavelength or frequency of, or an intensity of, the peak or valley. If the characteristic of the feature of interest is applicable to a wide variety of product substrates of different patterns, then the feature and characteristic can be pre-selected by the equipment manufacturer.

In addition, the polishing rate dD/dt near the polishing endpoint is determined (step 1104). For example, a plurality of set-up substrates can be polished in accordance with the polishing process to be used for polishing of product substrates, but with different polishing times that are near the expected endpoint polishing time. The set-up substrates can have the same pattern as the product substrate. For each set-up substrate, the pre-polishing and post-polishing thickness of a layer can be measured, and the amount removed calculated from the difference, and the amount removed and the associated polishing time for that set-up substrate are stored to provide a data set. A linear function of amount removed as a function of time can be fit to the data set; the slope of the linear function provides the polishing rate.

The algorithm set-up process includes measuring an initial thickness $D_1$ of a first layer of a set-up substrate (step 1106). The set-up substrate can have the same pattern as the product substrate. The first layer can be a dielectric, e.g., a low-k material, e.g., carbon doped silicon dioxide, e.g., Black Diamond™ (from Applied Materials, Inc.) or Coral™ (from Novellus Systems, Inc.).

Optionally, depending on the composition of the first material, one or more additional layers of another dielectric material, different from both the first and second dielectric materials, e.g., a low-k capping material, e.g., tetraethyl orthosilicate (TEOS), is deposited over the first layer (step 1107). Together, the first layer and the one or more additional layers provide a layer stack.

Next, the second layer of a different second dielectric material, e.g., e.g., a barrier layer, e.g., a nitride, e.g., tantalum nitride or titanium nitride, is deposited over the first layer or layer stack (step 1108). In addition, a conductive layer, e.g., a metal layer, e.g., copper, is deposited over the second layer (and in trenches provided by the pattern of the first layer) (step 1109).

Measurement can be performed at a metrology system other than the optical monitoring system to be used during polishing, e.g., an in-line or separate metrology station, such as a profilometer or optical metrology station that uses ellipsometry. For some metrology techniques, e.g., profilometry, the initial thickness of the first layer is measured before the second layer is deposited, but for other metrology techniques, e.g., ellipsometry, the measurement can be performed before or after the second layer is deposited.

The set-up substrate is then polished in accordance with a polishing process of interest (step 1110). For example, the conductive layer and a portion of the second layer can be polished and removed at a first polishing station using a first polishing pad (step 1110a). Then the second layer and a portion of the first layer can be polished and removed at a second polishing station using a second polishing pad (step 1110b). However, it should be noted that for some implementations, the there is no conductive layer, e.g., the second layer is the outermost layer when polishing begins.

At least during the removal of second layer, and possibly during the entire polishing operation at the second polishing station, spectra are collected using techniques described above (step 1112). In addition, a separate detection technique is used to detect clearing of the second layer and exposure of the first layer (step 1114). For example, exposure of the first layer can be detected by a sudden change in the motor torque or total intensity of light reflected from the substrate. The value $V_1$ of the characteristic of the feature of interest of the spectrum at the time $T_1$ of clearing of the second layer is detected and stored. The time $T_1$ at which the clearing is detected can also be stored.

Polishing can be halted at a default time after detection of clearing (step 1118). The default time is sufficiently large that polishing is halted after exposure of the first layer. The default time is selected so that the post-polish thickness is sufficiently near the target thickness that the polishing rate can be assumed to be linear between the post-polishing thickness and the target thickness. The value $V_2$ of the characteristic of the feature of interest of the spectrum at the time polishing is halted can be detected and stored, as can the time $T_2$ at which polishing was halted.

The post-polish thickness $D_2$ of the first layer is measured, e.g., using the same metrology system as used to measure the initial thickness (step 1120).

A default target change in value $\Delta V_D$ of the characteristic is calculated (step 1122). This default target change in value will be used in the endpoint detection algorithm for the product substrate. The default target change can be calculated from the difference between the value at the time of clearing of the second layer and the value at the time polishing is halted, i.e., $\Delta V_D = V_1 - V_2$.

A rate of change of the thickness as a function of the monitored characteristic dD/dV near the end of the polishing operation is calculated (step 1124). For example, assuming that the wavelength position of a peak is being monitored, then the rate of change can be expressed as Angstroms of material removed per Angstroms of shift in wavelength position of the peak. As another example, assuming that the frequency width of a peak is being monitored, then the rate of change can be expressed as Angstroms of material removed per Hertz of shift in frequency of the width of the peak.

In one implementation, a rate of change of the value as a function of time dV/dt can simply be calculated from the values at the times exposure of the second layer and at the end of polishing, e.g., $dV/dt = (D_2 - D_1)/(T_2 - T_1)$. In another implementation, a line can be fit to the measured values as a function of time using data from near the end of the polishing of the set-up substrate, e.g., the last 25% or less of the time between $T_1$ and $T_2$; the slope of the line provides a rate of change of the value as a function of time dV/dt. In either case, the rate of change of the thickness as a function of the monitored characteristic dD/dV is then calculated by dividing the polishing rate by the rate of change of the value, i.e., $dD/dV = (dD/dt)/(dV/dt)$. Once the rate of change dD/dV is calculated it should be remain constant for a product; it should not be necessary to recalculate dD/dV for different lots of the same product.

Once the set-up process has been completed, product substrates can be polished.

Optionally, an initial thickness $d_1$ of a first layer of at least one substrate from a lot of product substrate is measured (step 1202). The product substrates have at least the same layer structure, and optionally the same pattern, as the set-up substrates. In some implementations, not every product substrate is measured. For example, one substrate from a lot can be measured, and the initial thickness used for all other substrates from the lot. As another example, one substrate from a cassette can be measured, and the initial thickness used for all other substrates from the cassette. In other implementations, every product substrate is measured. Measurement of the thickness of the first layer of the product substrate can be performed before or after the set-up process is complete.

As noted above, the first layer can be a dielectric, e.g., a low-k material, e.g., carbon doped silicon dioxide, e.g., Black Diamond™ (from Applied Materials, Inc.) or Coral™ (from Novellus Systems, Inc.). Measurement can be performed at a metrology system other than the optical monitoring system to be used during polishing, e.g., an in-line or separate metrology station, such as a profilometer or optical metrology station that uses ellipsometry.

Optionally, depending on the composition of the first material, one or more additional layers of another dielectric material, different from both the first and second dielectric materials, e.g., a low-k capping material, e.g., tetraethyl orthosilicate (TEOS), is deposited over the first layer on the product substrate (step 1203). Together, the first layer and the one or more additional layers provide a layer stack.

Next, the second layer of a different second dielectric material, e.g., a barrier layer, e.g., a nitride, e.g., tantalum nitride or titanium nitride, is deposited over the first layer or layer stack of the product substrate (step 1204). In addition, a conductive layer, e.g., a metal layer, e.g., copper, can be deposited over the second layer of the product substrate (and in trenches provided by the pattern of the first layer) (step 1205).

For some metrology techniques, e.g., profilometry, the initial thickness of the first layer is measured before the second layer is deposited, but for other metrology techniques, e.g., ellipsometry, the measurement can be performed before or after the second layer is deposited. Deposition of the second layer and the conductive layer can be performed before or after the set-up process is complete.

For each product substrate to be polished, a target characteristic difference $\Delta V$ is calculated based on the initial thickness of the first layer (step 1206). Typically, this occurs before polishing begins, but it is possible for the calculation to occur after polishing begins but before the spectra feature tracking is initiated (in step 1210). In particular, the stored initial thickness $d_1$ of the product substrate is received, e.g., from a host computer, along with a target thickness $d_T$. In addition, the starting and ending thicknesses $D_1$ and $D_2$, the rate of change of the thickness as a function of the monitored characteristic dD/dV, and the default target change in value $\Delta V_D$ determined for the set-up substrate can be received.

In one implementation, the target characteristic difference $\Delta V$ is calculated as follows:

$$\Delta V = \Delta V_D + (d_1 - D_1)/(dD/dV) + (D_2 - d_T)/(dD/dV)$$

In some implementations, the pre-thickness will not be available. In this case, the "$(d_1 - D_1)/(dD/dV)$" will be omitted from the above equation, i.e., $$\Delta V = \Delta V_D + (D_2 - d_T)/(dD/dV)$$

The product substrate is polished (step 1208). For example, the conductive layer and a portion of the second layer can be polished and removed at a first polishing station using a first polishing pad (step 1208a). Then the second layer and a portion of the first layer can be polished and removed at a second polishing station using a second polishing pad (step 1208b). However, it should be noted that for some implementations, the there is no conductive layer, e.g., the second layer is the outermost when polishing begins.

Figure 13:
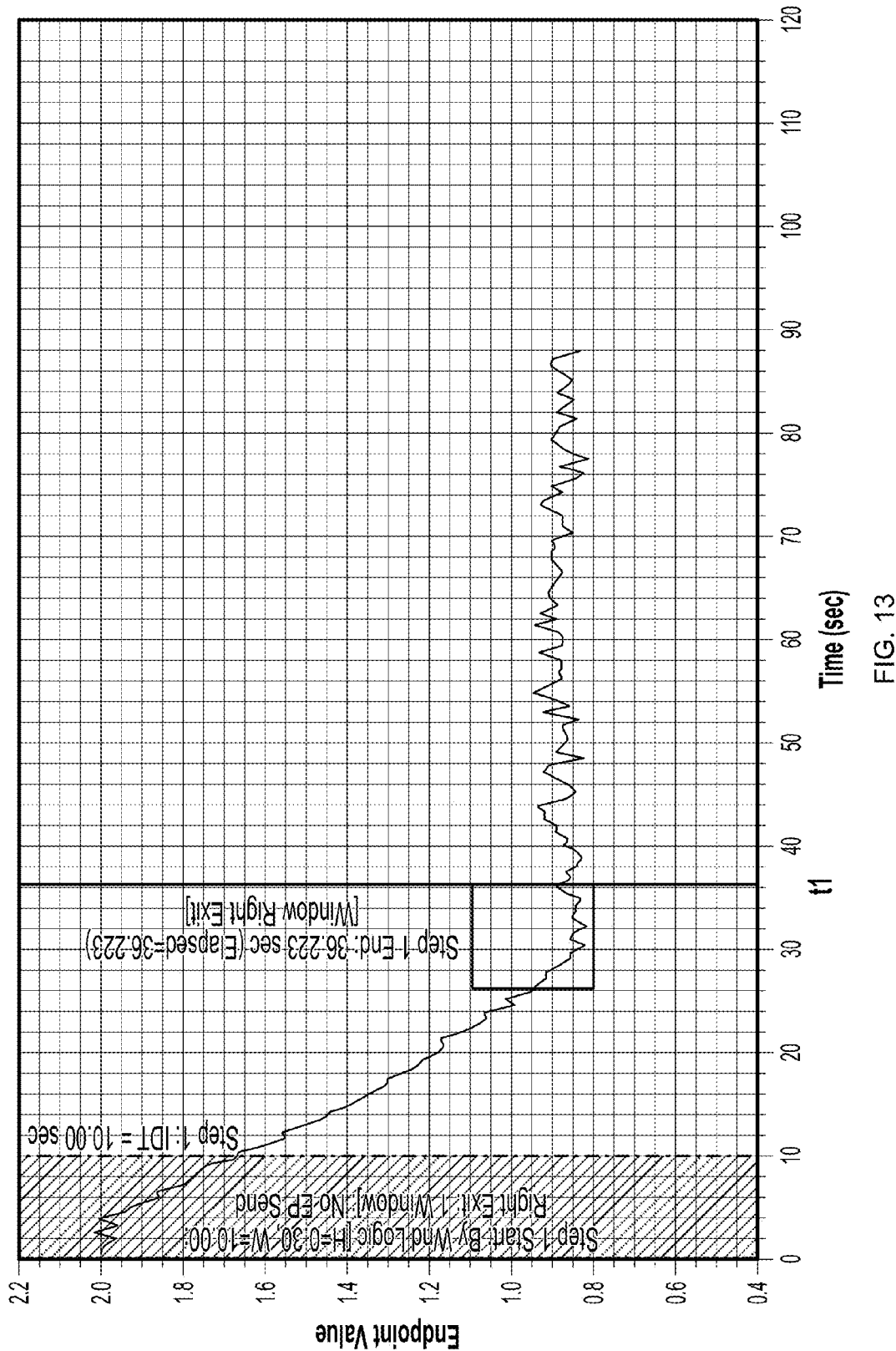
FIG. 13 illustrates a graph of total reflected intensity as a function of time during polishing.

An in-situ monitoring technique is used to detect clearing of the second layer and exposure of the first layer (step 1210). For example, exposure of the first layer at a time t1 can be detected by a sudden change in the motor torque or total intensity of light reflected from the substrate. For example, FIG. 13 shows a graph of the total intensity of light received from the substrate as a function of time during polishing of a metal layer to expose an underlying barrier layer. This total intensity can be generated from the spectral signal acquired by the spectral monitoring system by integrating the spectral intensity, e.g., across the all of wavelengths measured or across a preset wavelength range. Alternatively, rather than a total intensity, the intensity at a specific monochromatic wavelength can be used. As shown by FIG. 13, as the copper layer is being cleared, the total intensity falls, and when the barrier layer is completely exposed, the total intensity levels off. The leveling off of the intensity can be detected and used as a trigger to initiate the spectral feature tracking.

Figure 14:
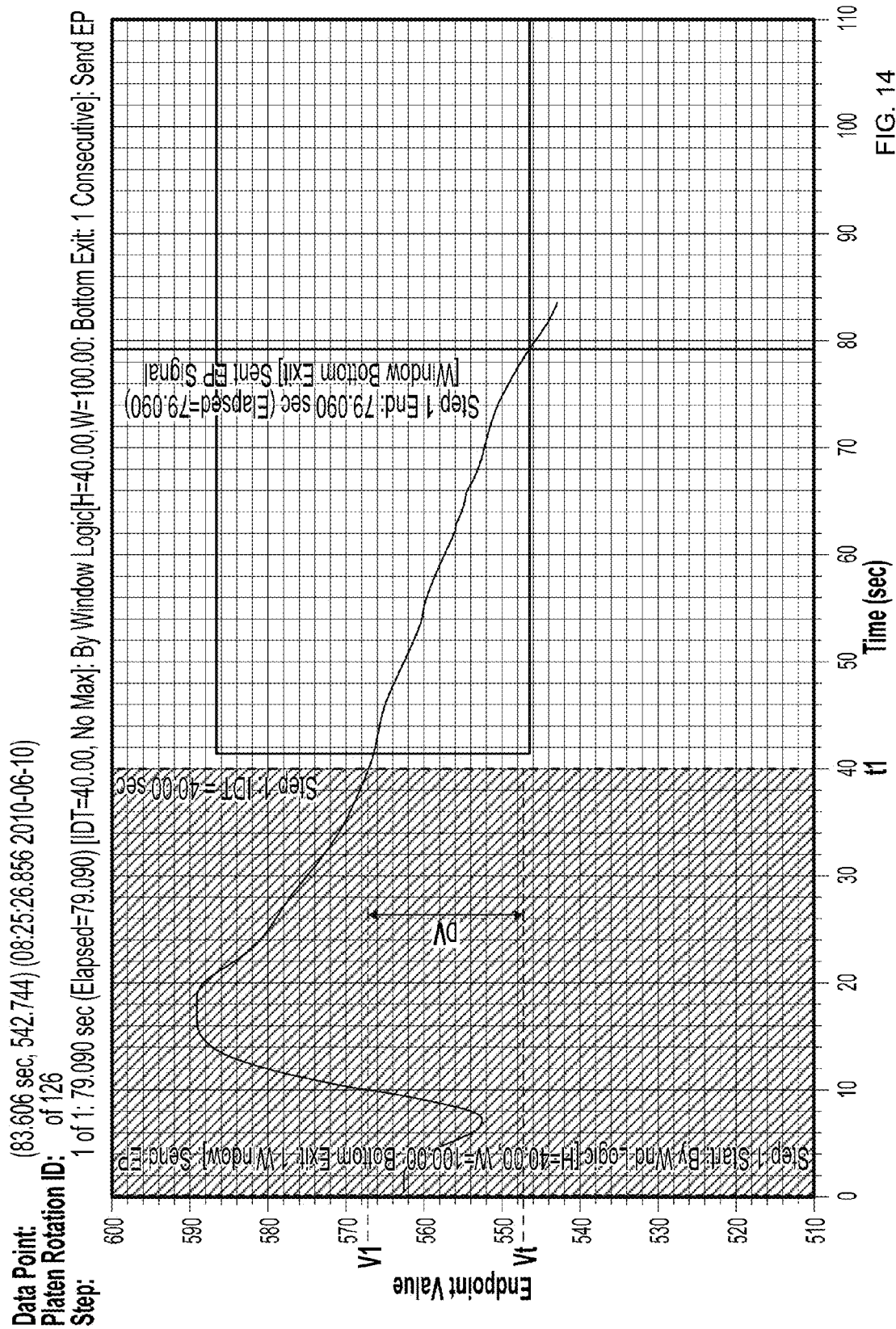
FIG. 14 illustrates a graph of the wavelength position of a spectral peak as a function of time during polishing.

Beginning at least with detection of the clearance of second layer (and potentially earlier, e.g., from the beginning of polishing of the product substrate with the second polishing pad), spectra are obtained during polishing using the in-situ monitoring techniques described above (step 1212). The spectra are analyzed using the techniques described above to determine the value of the characteristic of the feature being tracked. For example, FIG. 14 illustrates a graph of the wavelength position of a spectral peak as a function of time during polishing. The value $v_1$ of the characteristic of the feature being tracked in the spectrum at the time $t_1$ of clearing of the second layer is detected is determined.

The target value $v_T$ for the characteristic can now be calculated (step 1214). The target value $v_T$ can be calculated by adding the target characteristic difference $\Delta V$ to the value $v_1$ of the characteristic at the time $t_1$ of clearing of the second layer, i.e., $v_T = v_1 + \Delta V$.

When the characteristic of the feature being tracked reaches the target value, polishing is halted (step 1216). In particular, for each measured spectrum, e.g., in each platen rotation, the value of the characteristic of the feature being tracked is determined to generate a sequence of values. As described above with reference to FIG. 6A, a function, e.g., a linear function of time, can be fit to the sequence of values. In some implementations, the function can be fit to values within a time window. Where the function meets the target value provides the endpoint time at which polishing is halted. The value $v_1$ of the characteristic at the time $t_1$ of clearing of the second layer is detected can also be determined by fitting a function, e.g., a linear function, to portion of the sequence of values near time $t_1$.

Variations of underlying layers, e.g., the thickness of the underlying layers, can occasionally make it difficult to determine the thickness of the layer being polished based on a single characteristic. In another embodiment, two characteristics, e.g., a wavelength (or frequency) and an associated intensity value, of a selected spectral feature are tracked during polishing. The pair of values for the two characteristics defines a coordinate of the spectral feature in the two-dimensional space of the two characteristics, and a polishing endpoint or adjustment to a polishing parameter can be based on the path of the coordinate of the feature in the two-dimensional space. For example, a polishing endpoint can be determined based on the distance traveled by the coordinate in the two-dimensional space. Tracking changes in two characteristics, e.g., a wavelength and an associated intensity value, of the selected spectral feature can improve accuracy of endpoint control and can allow greater uniformity in polishing between substrates within a batch or between batches. In general, except as described below, this embodiment can use the various techniques of the embodiments described above.

Figure 15A:
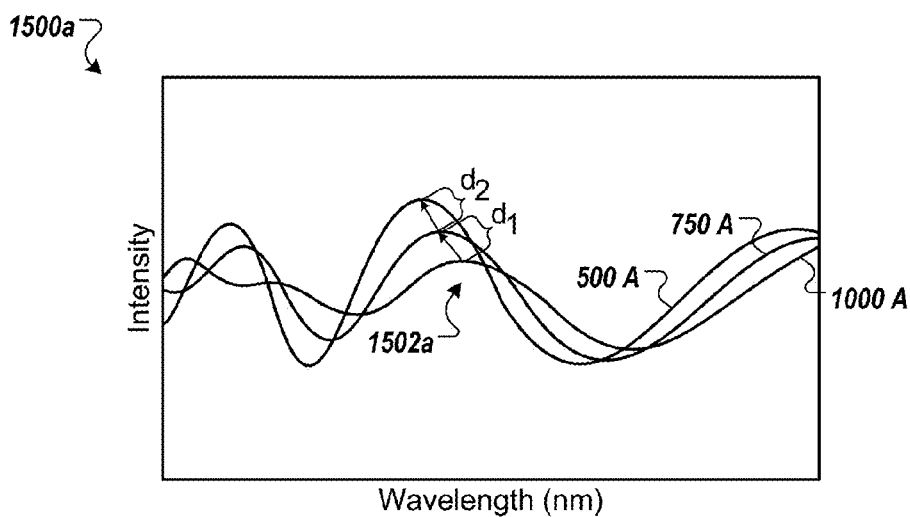
FIGS. 15A-C illustrate graphs of sequences of spectra taken with varying underlying layer thicknesses.
Figure 15B:
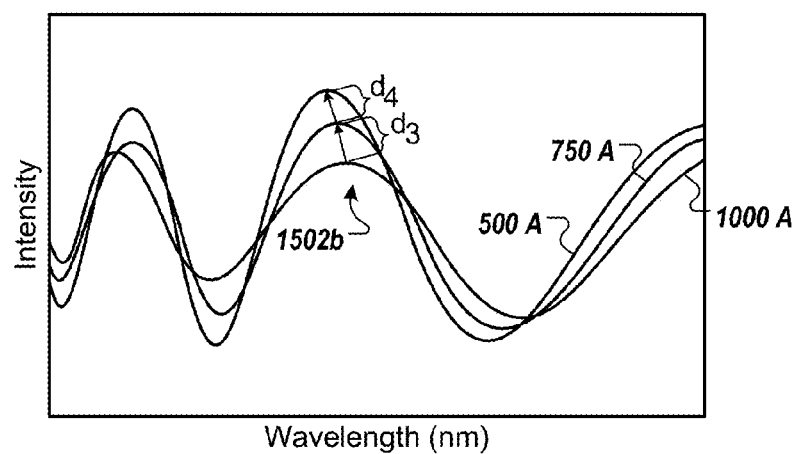
Figure 15C:
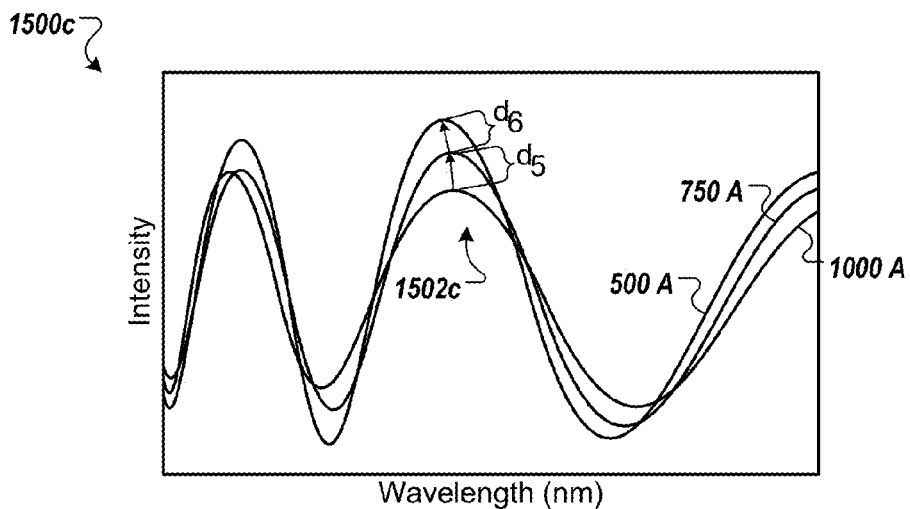

FIGS. 15A-C illustrate graphs of sequences of spectra 1500*a-c* taken with from substrates with different underlying layer thicknesses. For example, the sequences of spectra 1500*a-c* are measured while polishing a first layer, e.g., a low-k material, with an initial thickness of 1000 Angstroms. An underlying layer, e.g., an etch stop layer, is deposited below the first layer and has a thickness, e.g., of 50, 130, and 200 Angstroms respectively for the sequences of spectra 1500*a-c*. The sequences of spectra 1500*a-c* include spectra measurements taken during polishing when the first layer has different thicknesses, e.g., when the first layer is 1000, 750, and 500 Angstroms thick respectively.

The sequences of spectra 1500*a-c* include peaks 1502*a-c* that evolve, e.g., change in intensity (maximum of the peak) and position (wavelength or frequency of the maximum), as polishing progresses. For example, the peak shifts to higher intensity and lower wavelength as material is removed. The initial intensity and wavelength of the peaks 1502*a-c* can vary based on the thickness of the underlying layer and the change in the characteristic values is different for each of the varying underlying layer thicknesses.

What has been discovered is that, at least for some fabrication of some dies, although removal of the same amount may cause the peak to shift different amounts depending on the underlying layer thickness, for removal of a given amount of material from the overlying layer, the distance traveled by the coordinate representing the peak in a two-dimensional space of intensity and wavelength is generally insensitive to the underlying layer thickness.

The distance between consecutive peak measurements, i.e., the selected peak in consecutive spectra measurements, e.g., spectra measurements from consecutive sweeps of the optical monitoring system below the substrate, as defined by coordinates in the two-dimension space of intensity and wavelength can be used to determine the polishing rate of a location of interest on a substrate. For example, the Euclidian distances $d_1$, $d_3$, and $d_5$, between the starting peak coordinates and the second peak coordinates, e.g., the peak measurements when the first layer is 750 Angstroms thick, are the same (or very similar) for all the sequences of spectra 1500*a-c*. Similarly, the Euclidian distances $d_2$, $d_4$, and $d_6$ between the second peak coordinates and the third peak coordinates are the same (or very similar), and the sums of the respective pairs of Euclidian distances are the same (or very similar), e.g., $d_1$ combined with $d_2$ is the same as $d_3$ combined with $d_4$. The third peak coordinates can be associated with the measurements of the peaks 1502*a-c* when the first layer is 500 Angstroms thick.

Figure 16A:
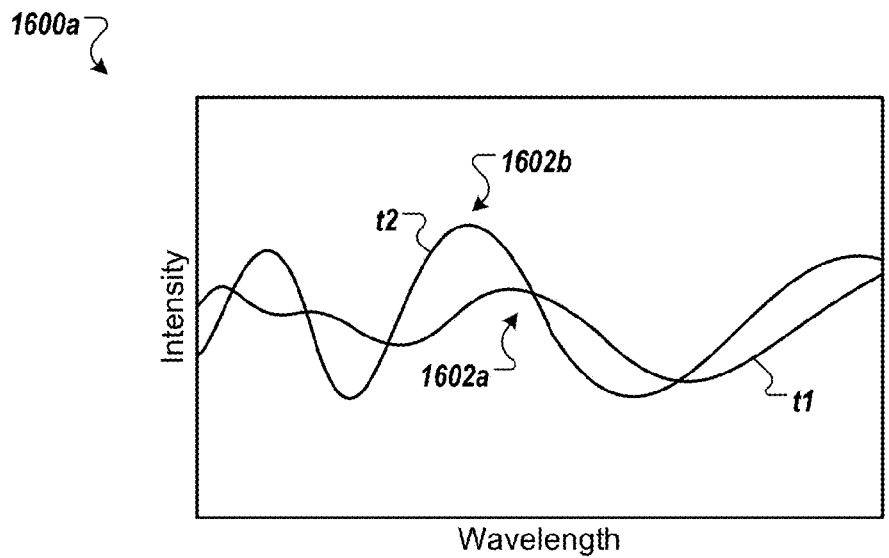
FIG. 16A illustrates a graph of spectra measured at two different times from a set-up substrate.

FIG. 16A illustrates a graph 1600*a* of spectra measured at two different times from a set-up substrate. For example, a first spectrum can be measured at time $t_1$ when polishing of the first layer begins, e.g., as detected using the techniques described above with reference to FIG. 13 and step 1114, and a second spectrum can be measured at time $t_2$ when polishing of the first layer ends, e.g., at a predetermined polishing time. The two spectra can be measured during polishing of the set-up substrate in order to determine a threshold distance $D_T$ in the change of coordinates associated with an identified spectral feature, e.g., a peak (peak 1602*a* in the first spectrum and peak 1602*b* in the second spectrum).

Figure 16B:
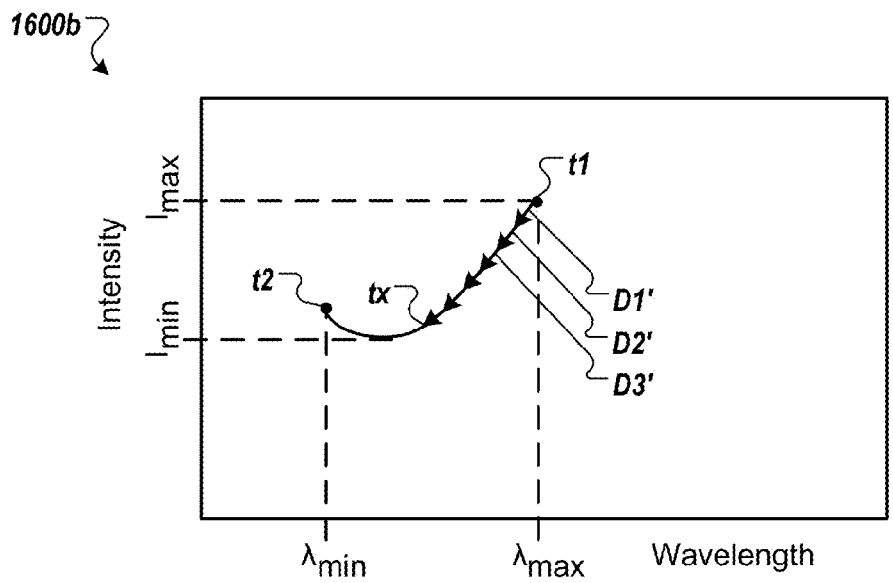
FIG. 16B illustrates a graph of the change in two feature characteristics while a set-up substrate is being polished.

FIG. 16B illustrates a graph 1600*b* of the change in two feature characteristics while a substrate, e.g., the set-up substrate, is being polished. For example, the wavelength and intensity measurements of an identified spectral feature in a sequence of spectra can be represented in the graph 1600*b* by a sequence of coordinates in two-dimensional space. For example, the location values, e.g., wavelength values, are plotted on the x-axis and the intensity values are plotted on the y-axis. The graph 1600*b* includes wavelength and intensity measurements of the peak 1602*a* taken at time $t_1$ and the corresponding measurements of the peak until polishing of the set-up substrate is stopped at time $t_2$.

A maximum intensity $I_{max}$ and a minimum intensity $I_{min}$ associated with the peak 1602 can be determined. Additionally, a maximum wavelength or frequency $\lambda_{max}$ and a minimum wavelength or frequency $\lambda_{min}$ associated with the peak 1602 can be determined. The maximum and minimum values can be used to normalize the location and intensity values measured during polishing of product substrates. In some implementations, the feature characteristic values are normalized so that both feature characteristic values are on the same scale, e.g., zero to one, and one of the feature characteristic values does not have more weight than the other.

The threshold distance $D_T$ can be determined after polishing of the set-up substrate by combining, e.g., summing, the distances between consecutive coordinates in the sequence of coordinates. For example, a time $t_1$ can be identified when the first layer is exposed (e.g., using the techniques described above with reference to FIG. 13 and step 1114). Consecutive distance values $D1'$, $D2'$, $D3'$, etc. associated with measured spectra taken after time $t_1$ can be calculated and combined in order to determine a total distance the threshold distance $D_T$. A determination can be made that a target thickness of the first layer was remaining at time $t_x$ and the threshold distance $D_T$ is determined to be the sum of the consecutive distance values $D1'$, $D2'$, $D3'$, etc. from time $t_1$ to time $t_x$. In some implementations, the time $t_x$ is the same as the time $t_2$.

In some implementations, the feature characteristic values are normalized and a Euclidean distance D between two consecutive coordinates is determined as follows:

$$D = \sqrt{\left(\frac{I_p - I_{current}}{I_{normal}}\right)^2 + \left(\frac{\lambda_p - \lambda_{current}}{\lambda_{normal}}\right)^2}$$

where, $I_p$ is the intensity of the spectral feature in the previous coordinate, $I_{current}$ is the intensity of the spectral feature in the current coordinate, $\lambda_p$ is the wavelength or frequency of the spectral feature in the previous coordinate, $\lambda_{current}$ is the wavelength or frequency of the spectral feature in the current coordinate, $I_{normal} = I_{max} - I_{min}$, and $\lambda_{normal} = \lambda_{max} - \lambda_{min}$. It is possible to use a distance metric other than the Euclidean distance. For example, in some implementations, the distance D between two consecutive coordinates is determined as follows:

$$D = \left|\frac{I_p - I_{current}}{I_{normal}}\right| + \left|\frac{\lambda_p - \lambda_{current}}{\lambda_{normal}}\right|.$$

In addition, although both equations for calculation of distance above use equal weighting of the two normalized characteristics being tracked, it is possible for the distance to be calculated with unequal weighting.

Figure 16C:
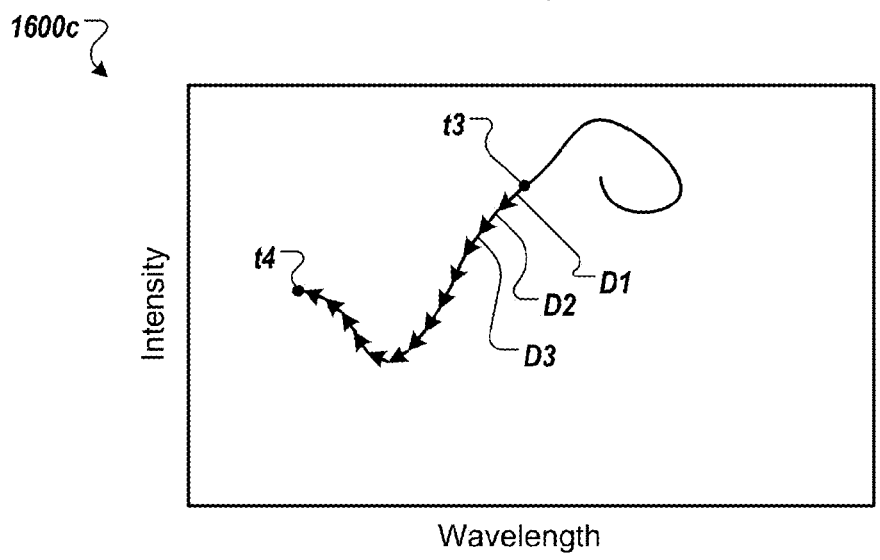
FIG. 16C illustrates a graph of a sequence of coordinates associated with feature characteristic values.

Once the threshold distance $D_T$ has been identified, one or more product substrates can be polished. A time $t_3$ can be determined when the first layer, or another layer being polished, is exposed (e.g., using the techniques described above with reference to FIG. 13 and step 1114). For each platen revolution, a current spectrum can be measured and current characteristic values can be determined that are associated with a selected spectral feature being tracked. In some implementations, the characteristic values can be normalized as described in more detail below (e.g., intensity values can be divided by $I_{normal}$, or $I_{max}$, and wavelength or frequency values can be divided by $\lambda_{normal}$, or $\lambda_{max}$). FIG. 16C illustrates a graph 1600c of a sequence of coordinates associated with feature characteristic values that have been determined from a sequence of spectra taken during polishing of a product substrate.

The current characteristic values can be used to determine a current coordinate associated with the selected spectral feature and the distance between consecutive coordinates, e.g., D1, D2, D3, etc., can be determined (e.g., using one of the techniques described above with reference to FIG. 16B). The sequence of coordinates between the starting coordinate determined at time $t_3$ and the current coordinate can define a path and the distances D1, D2, D3, etc. can be used to determine the length of the path, e.g., by combining, e.g., summing, the distances. For example, the length of the path can be the distance between the starting coordinate and the current coordinate. The current length of the path is compared with the threshold distance $D_T$, and when the length of the path exceeds the threshold distance $D_T$, e.g., at time $t_4$, endpoint is called.

In some implementations, the Euclidian distance between the starting coordinate and the current coordinate is not the same as the length of the path made by consecutive coordinates between the starting coordinate and the current coordinate. In some implementations, the Euclidian distance formed by a straight line between the starting coordinate and the current coordinate can be used to determine polishing rate or endpoint.

In some implementations, the feature characteristic values can be normalized during generation of the sequence of coordinates. For example, the feature characteristic values are divided by $I_{normal}$ or $\lambda_{normal}$ respectively, and the normalized values are used to determine the associated coordinate in the graph 1600c. In these implementations, the technique used to determine the distance between consecutive coordinates does not need to normalize the coordinate values. For example, a Euclidean distance between two consecutive coordinate values is determined as follows:

$$D = \sqrt{(I_p - I_{current})^2 + (\lambda_p - \lambda_{current})^2},$$

where $I_p$ is the normalized intensity of the spectral feature in the previous coordinate, $I_{current}$ is the normalized intensity of the spectral feature in the current coordinate, $\lambda_p$ is the normalized wavelength or frequency of the spectral feature in the previous coordinate, and $\lambda_{current}$ is the normalized wavelength or frequency of the spectral feature in the current coordinate.

Instead of or in addition to detecting the polishing endpoint, the movement of the coordinate in the two-dimensional space can be used to adjust a polishing rate in one of the zones of the substrate in order to reduce within-wafer non-uniformity (WIWNU). In particular, multiple sequences of spectra of light may be from different portions of the substrate, e.g., from a first portion and a second portion. The location and associated intensity value of the selected spectral feature in the respective sequences of spectra for the different portions can be measured to generate a multiple sequences of coordinates, e.g., a first sequence for the first portion and a second sequence for a second portion of the substrate. For each sequence of coordinates, a distance can be determined using one of the techniques described above, e.g., the first and second sequence of coordinates may include first and second respective starting coordinates and first and second respective current coordinates, and first and second respective distances can be determined from the first and second respective staring coordinates to the first and second respective current coordinates. The first distance can be compared to the second distance to determine an adjustment for the polishing rate. In particular, the polishing pressures on different regions of the substrate can be adjusted using the techniques described above, e.g., with reference to FIG. 6B, but substituting the calculated distances for the difference values.

Although the technique described above uses wavelength, other measures of the feature position, such as frequency, could be used. For a peak, the position of the peak can be calculated as the wavelength or frequency at the maximum value of the peak, at the middle of the peak, or at a median of the peak. In addition, although the technique described above uses the pair of position and intensity, the technique can be applied to other pairs or triplets of characteristics, such as feature position and feature width, or feature intensity and feature width.

In some implementations, the polishing apparatus 20 identifies multiple spectra for each platen revolution and averages the spectra taken during a current revolution in order to determine the two current characteristic values associated with an identified spectral feature. In some implementations, after a predetermined number of spectra measurements, the spectra measurements are averaged to determine the current characteristic values. In some implementations, median characteristic values or median spectra measurements from a sequence of spectra measurements are used to determine the current characteristic values. In some implementations, spectra that are determined to not be relevant are discarded before determining the current characteristic values.

FIG. 17A provides an example of a measured spectrum 1700a of light reflected from the substrate 10. The optical monitoring system can pass the spectrum 1700a through a low-pass filter in order to reduce noise in the spectral intensity, resulting in a spectrum 1700b shown in FIG. 17B. A low-pass filter can be used to smooth the spectra in order to reduce oscillations or spikes in the spectra. The low-pass filter can be used to make feature tracking easier, e.g., determination of multiple feature characteristics as described above with reference to FIGS. 16A-C. Examples of low-pass filters include moving average and Butterworth filters.

As discussed above, for some techniques and some layer stacks, detection of clearance of the overlying layer and exposure of the underlying layer can be difficult. In some implementations, a sequence of groups of spectra are collected, and a value of a dispersion parameter is calculated for a each group of spectra to generate sequence of dispersion values. The clearance of the overlying layer can be detected from the sequence of dispersion values. This technique can be used to detect clearing of the second layer and exposure of the first layer, e.g., in steps 1114 or 1210 of the polishing operations described above.

Figure 18:
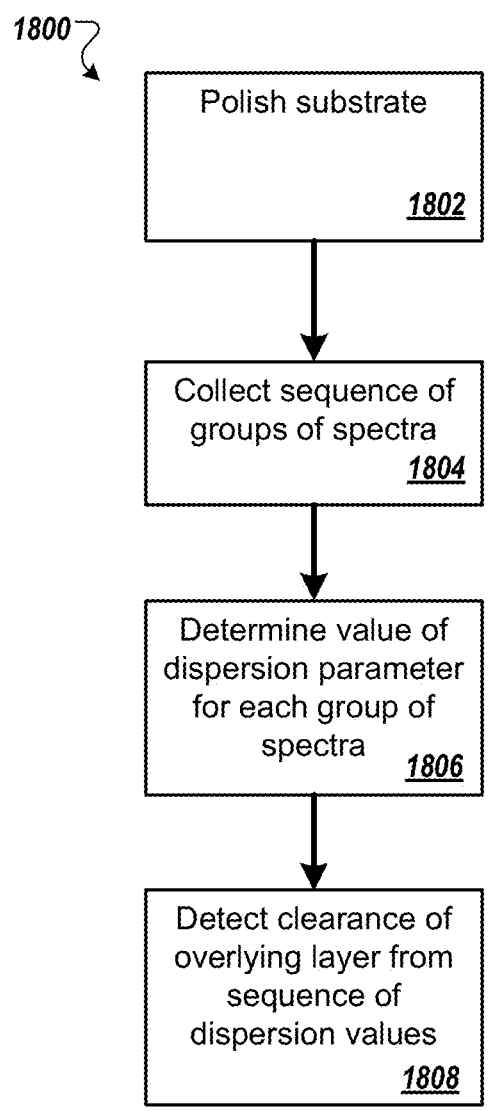
FIG. 18 shows a flow chart for detecting clearance of an overlying layer.

FIG. 18 shows a method 1800 for detecting clearance of the second layer and exposure of the first layer. As the substrate is being polished (step 1802), a sequence of groups of spectra are collected (step 1804). As shown in FIG. 2, if the optical monitoring system is secured to a rotating platen, then in a single sweep of the optical monitoring system across the substrate, spectra can be collected from multiple different locations 201-211 on the substrate. The spectra collected from a single sweep provides a group of spectra. As polishing progresses, multiple sweeps of the optical monitoring system provide a sequence of groups of spectra. One group of spectra can be collected for each platen rotation, e.g., the groups can be collected at frequency equal to the platen rotation rate. Typically, each group will include five to twenty spectra. The spectra can be collected using the same optical monitoring system that is used to collect spectra for the peak tracking technique discussed above.

Figure 19A:
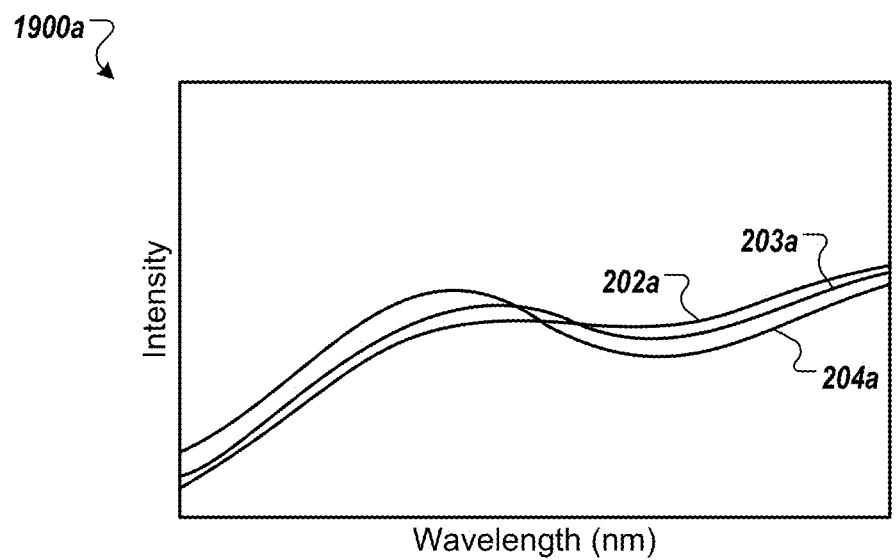
FIG. 19A shows a graph of spectra collected during a single sweep at the beginning of polishing.
Figure 19B:
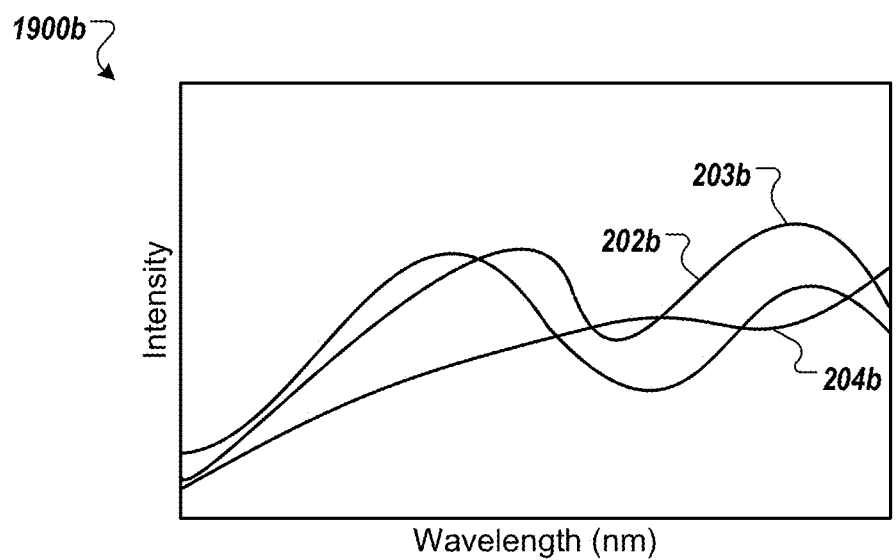
FIG. 19B shows a graph of spectra collected during a single sweep near barrier clearing.

FIG. 19A provides an example of a group of measured spectra 1900a of light reflected from the substrate 10 at the beginning of polishing, e.g., when a significant thickness of the overlying layer remains over the underlying layer. The group of spectra 1900a can include spectra 202a-204a collected at different locations on the substrate in a first sweep of the optical monitoring system across the substrate. FIG. 19B provides an example of a group of measured spectra 1900b of light reflected from the substrate 10 at or near clearance of the overlying layer. The group of spectra 1900b can include spectra 202b-204b collected at different locations on the substrate in a different second sweep of the optical monitoring system across the substrate (the spectra 1900a can be collected from different locations on the substrate than the spectra 1900b).

Initially, as shown in FIG. 19A, the spectra 1900a are fairly similar. However, as shown in FIG. 19B, as the overlying layer, e.g., a barrier layer, is cleared, and the underlying layer, e.g., a low-k or capping layer, is exposed, differences between the spectra 1900b from different locations on the substrate tend to become more pronounced.

For each group of spectra, a value of a dispersion parameter of the spectra in the group is calculated (step 1806). This generates a sequence of dispersion values.

In one implementation, to calculate a dispersion parameter for a group of spectra, the intensity values (as a function of wavelength) are averaged together to provide an average spectrum. That is $I_{AVE}(\lambda)=(1/N)\Sigma_{i=1}^{N}I(\lambda_i)$, where N is the number of spectra in the group and $I(\lambda_i)$ are the spectra.

For each spectrum in the group, a total difference between the spectrum and the average spectrum can then be calculated, e.g., using a sum of squares difference or sum of absolute values difference, e.g., $D_i=[1/(\lambda_a-\lambda_b)\cdot\int_\lambda[I(\lambda_i-I_{AVE}(\lambda)]^2]^{1/2}$ or $D_i=[1/(\lambda_a-\lambda_b)\cdot\int_\lambda|I(\lambda_i)-I_{AVE}(\lambda)|]^{1/2}$, where $\lambda_a$ to $\lambda_b$ is the wavelength range being integrated over.

Once a difference value has been calculated for each spectrum in the group of spectra, the value of the dispersion parameter can be calculated for the group from the difference values. A variety of dispersion parameters are possible, such as standard deviation, interquartile range, range (maximum value minus minimum value), mean difference, median absolute deviation and average absolute deviation.

The sequence of dispersion values can be analyzed and used to detect clearance of the overlying layer (step 1808).

Figure 20:
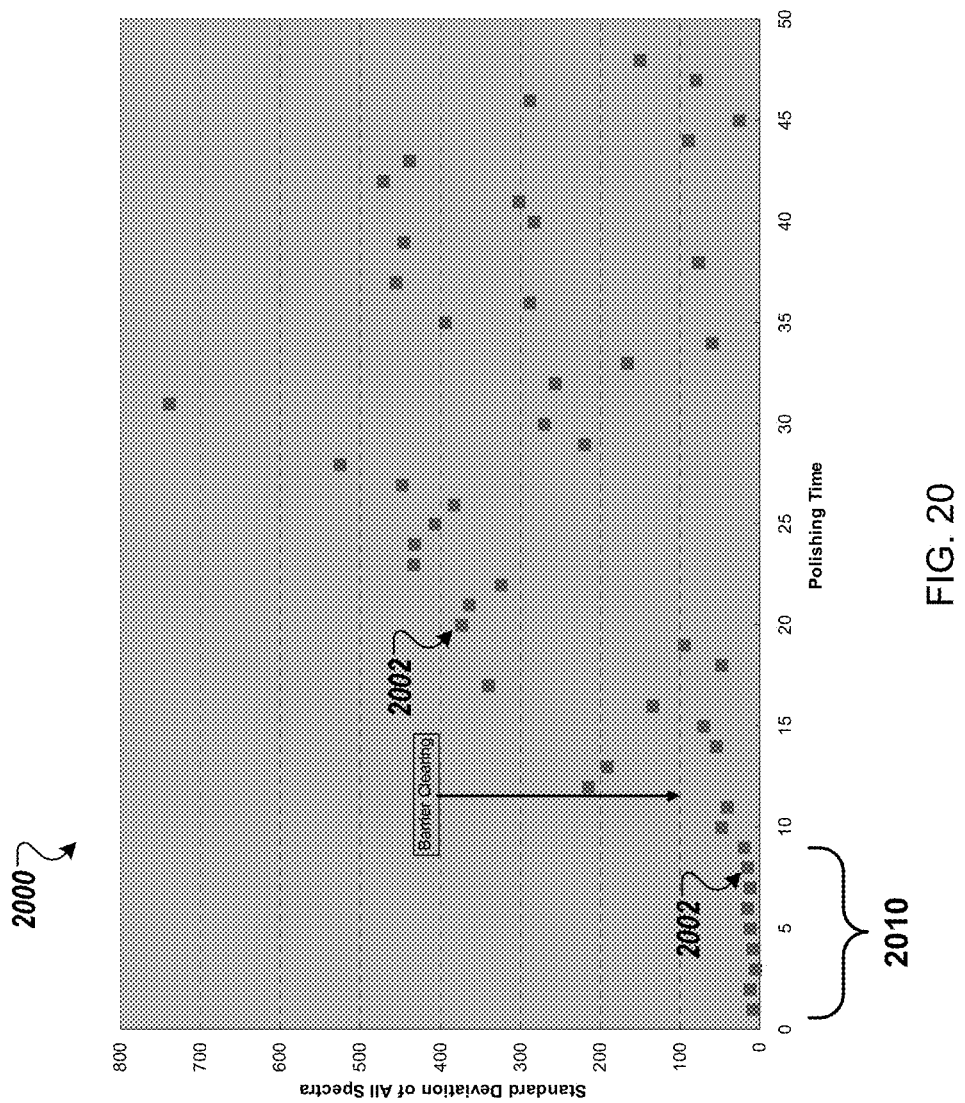
FIG. 20 shows a graph of standard deviation of spectra as a function of polishing time.

FIG. 20 shows a graph 2000 of the standard deviation of the spectra as a function of polishing time (with each standard deviation calculated from the difference values of a group of spectra). Thus, each plotted point 2002 in the graph is a standard deviation for the difference values of the group of spectra collected at a given sweep of the optical monitoring system. As illustrated, the standard deviation values remain fairly low during a first time period 2010. However, after time period 2010, the standard deviation values become larger and more disperse. Without being limited to any particular theory, a thick barrier layer may tend to dominate the reflected spectrum, masking differences in thickness of the barrier layer itself and any underlying layer. As polishing progresses, the barrier layer becomes thinner or is completely removed, and the reflected spectrum becomes more sensitive to variations in the underlying layer thickness. As a result, the dispersion of the spectra will tend to increase as the barrier layer is cleared.

A variety of algorithms can be used to detect the change in behavior of the dispersion values when the overlying layer is clearing. For example, the sequence of dispersion values can be compared to a threshold, and if a dispersion value exceeds the threshold, then a signal is generated indicating that the overlying layer has cleared. As another example, a slope of a portion of the sequence of dispersion values within a moving window can be calculated, and if the slope exceeds a threshold value then a signal is generated indicating that the overlying layer has cleared.

As part of the algorithm to detect the increase in dispersion, the sequence of dispersion values can be subject to a filter, e.g., a low-pass or band filter, in order to remove high frequency noise. Examples of low-pass filters include moving average and Butterworth filters.

Although the discussion above focuses on detection of clearance of a barrier layer, the technique can be used detection clearance of an overlying layer in other contexts, e.g., clearance of an overlying layer in another type semiconductor process that uses dielectric layer stacks, e.g., interlayer dielectric (ILD), or clearance of a thin metal layer over a dielectric layer.

In addition to use as trigger for initiating feature tracking as discussed above, this technique for detecting clearance of an overlying layer can be used for other purposes in a polishing operation, e.g., to be used as the endpoint signal itself, to trigger a timer so that the underlying layer is polished for a predetermined duration following exposure, or as a trigger to modify polishing parameter, e.g., to change carrier head pressure or slurry composition upon exposure of the underlying layer.

In addition, although the discussion above assumes a rotating platen with an optical endpoint monitor installed in the platen, system could be applicable to other types of relative motion between the monitoring system and the substrate. For example, in some implementations, e.g., orbital motion, the light source traverses different positions on the substrate, but does not cross the edge of the substrate. In such cases, the collected spectra can still be grouped, e.g., spectra can be collected at a certain frequency and spectra collected within a time period can be considered part of a group. The time period should be sufficiently long that five to twenty spectra are collected for each group.

As used in the instant specification, the term substrate can include, for example, a product substrate (e.g., which includes multiple memory or processor dies), a test substrate, a bare substrate, and a gating substrate. The substrate can be at various stages of integrated circuit fabrication, e.g., the substrate can be a bare wafer, or it can include one or more deposited and/or patterned layers. The term substrate can include circular disks and rectangular sheets.

Embodiments of the invention and all of the functional operations described in this specification can be implemented in digital electronic circuitry, or in computer software, firmware, or hardware, including the structural means disclosed in this specification and structural equivalents thereof, or in combinations of them. Embodiments of the invention can be implemented as one or more computer program products, i.e., one or more computer programs tangibly embodied in an information carrier, e.g., in a machine-readable storage device or in a propagated signal, for execution by, or to control the operation of, data processing apparatus, e.g., a programmable processor, a computer, or multiple processors or computers. A computer program (also known as a program, software, software application, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file. A program can be stored in a portion of a file that holds other programs or data, in a single file dedicated to the program in question, or in multiple coordinated files (e.g., files that store one or more modules, sub-programs, or portions of code). A computer program can be deployed to be executed on one computer or on multiple computers at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application-specific integrated circuit).

The above described polishing apparatus and methods can be applied in a variety of polishing systems. Either the polishing pad, or the carrier head, or both can move to provide relative motion between the polishing surface and the substrate. For example, the platen may orbit rather than rotate. The polishing pad can be a circular (or some other shape) pad secured to the platen. Some aspects of the endpoint detection system may be applicable to linear polishing systems, e.g., where the polishing pad is a continuous or a reel-to-reel belt that moves linearly. The polishing layer can be a standard (for example, polyurethane with or without fillers) polishing material, a soft material, or a fixed-abrasive material. Terms of relative positioning are used; it should be understood that the polishing surface and substrate can be held in a vertical orientation or some other orientation.

Particular embodiments of the invention have been described. Other embodiments are within the scope of the following claims. For example, the actions recited in the claims can be performed in a different order and still achieve desirable results.

What is claimed is:
1. A method of polishing, comprising:
receiving an identification of a selected spectral feature and a spectral characteristic of the selected spectral feature to monitor during polishing;
polishing a substrate having a second layer overlying a first layer;
measuring a sequence of groups of spectra of light from the substrate while the substrate is being polished, each group of the groups of spectra including spectra from different locations on the substrate;
for each group, calculating a value for a dispersion parameter of the spectra in the group to generate a sequence of dispersion values, the dispersion parameter being a measure of variability of the spectra in the group;
detecting exposure of the first layer based on the sequence of dispersion values;
after detecting exposure of the first layer, measuring a sequence of spectra of light from the substrate while the substrate is being polished;
determining a first value of the spectral characteristic of the feature in a spectrum from the sequence of groups of spectra at a time that exposure of the first layer is detected;
adding an offset to the first value to generate a second value; and
monitoring the spectral characteristic of the feature in the sequence of spectra and halting polishing when the spectral characteristic of the feature is determined to reach the second value.
2. The method of claim 1, wherein calculating the value of the dispersion parameter comprises calculating a difference value for each spectrum in the group to generate a plurality of difference values.

3. The method of claim 2, wherein calculating the value of the dispersion parameter comprises calculating a standard deviation, range, mean difference, median absolute deviation or average absolute deviation of the plurality of difference values.

4. The method of claim 3, wherein calculating the value of the dispersion parameter comprises calculating the standard deviation.

5. The method of claim 2, wherein calculating the difference value comprises calculating an average spectrum from the spectra in the group, and calculating a total difference between the spectrum and the average spectrum.

6. The method of claim 1, wherein detecting exposure of the first layer comprises comparing the sequence of dispersion values to a threshold.

7. The method of claim 1, wherein detecting exposure of the first layer comprises determining a slope from the sequence of dispersion values and comparing the slope to a threshold.

8. The method of claim 1, further comprising modifying a polishing parameter when exposure of the first layer is detected.

9. The method of claim 1, further comprising halting polishing when exposure of the first layer is detected.

10. The method of claim 1, further comprising:
determining a position value of the selected spectral feature along the spectrum and an associated intensity value of the selected spectral feature for each of the spectra in the sequence of spectra to generate a sequence of coordinates in multi-dimensional space, the coordinates being pairs of position values and associated intensity values;
determining a starting coordinate from the spectrum from the sequence of groups of spectra at the time that exposure of the first layer is detected;
determining a distance in the multi-dimensional space from the staring coordinate to a current coordinate; and
determining at least one of a polishing endpoint or an adjustment for a polishing rate based on the distance.

11. The method of claim 1, wherein measuring the sequence of groups of spectra of light from the substrate comprises making a plurality of sweeps of a sensor across the substrate.

12. The method of claim 11, wherein each group of spectra from the sequence of groups corresponds to a single sweep of the sensor from the plurality of sweeps.

13. The method of claim 11, wherein making the plurality of sweeps of the sensor across the substrate comprises rotating a platen having the sensor fixed thereto.

14. The method of claim 1, further comprising filtering the sequence of dispersion values.

15. The method of claim 1, wherein the second layer is a barrier layer.

16. The method of claim 15, wherein the first layer is a dielectric layer having a different composition than the barrier layer.

17. The method of claim 16, wherein the barrier layer is tantalum nitride or titanium nitride and the dielectric layer is carbon doped silicon dioxide or is formed from tetraethyl orthosilicate.

18. The method of claim 1, wherein the feature comprises a peak, valley, inflection points, or zero-crossing in the spectrum.

19. The method of claim 1, wherein the spectral characteristic comprises a position value of the selected spectra feature along the spectrum, or a width or an intensity of the selected spectral feature.

20. A polishing apparatus, comprising:
a support to hold a polishing pad;
a carrier head to hold a substrate against the polishing pad;
a motor to generate relative motion between the carrier head and the support to polish the substrate;
an optical monitoring system to measure a sequence of groups of spectra of light from the substrate while the substrate is being polished, the relative motion between the carrier head and the support causing each group of the groups of spectra to include spectra from different locations on the substrate; and
a controller configured to, for each group, calculate a value for a dispersion parameter of the spectra in the group to generate a sequence of dispersion values, the dispersion parameter being a measure of variability of the spectra in the group, and detect exposure of a first layer based on the sequence of dispersion values, receive an identification of a selected spectral feature and a spectral characteristic of the selected spectral feature to monitor during polishing, after detecting exposure of the first layer receive measurements of a sequence of spectra of light from the substrate while the substrate is being polished, determine a first value for the spectral characteristic of the feature in a spectrum from the sequence of groups of spectra at a time that exposure of the first layer is detected, add an offset to the first value to generate a second value, and monitor the spectral characteristic of the feature in the sequence of spectra and cause polishing to halt when the spectral characteristic of the feature is determined to reach the second value.

21. A computer program product, tangibly embodied in a machine readable storage device, comprising instructions to:
receive an identification of a selected spectral feature and a spectral characteristic of the selected spectral feature to monitor during polishing;
polish a substrate having a second layer overlying a first layer;
receive measurements of a sequence of groups of spectra of light from the substrate while the substrate is being polished, each group of the groups of spectra including spectra from different locations on the substrate;
for each group, calculate a value for a dispersion parameter of the spectra in the group to generate a sequence of dispersion values, the dispersion parameter being a measure of variability of the spectra in the group;
detect exposure of the first layer based on the sequence of dispersion values;
after detecting exposure of the first layer, receive measurements of a sequence of spectra of light from the substrate while the substrate is being polished;
determine a first value for the spectral characteristic of the feature in a spectrum from the sequence of groups of spectra at a time that exposure of the first layer is detected;
add an offset to the first value to generate a second value; and
monitor the spectral characteristic of the feature in the sequence of spectra and cause polishing to halt when the spectral characteristic of the feature is determined to reach the second value.

* * * * *